United States Patent
Zediker et al.

(10) Patent No.: US 6,917,729 B2
(45) Date of Patent: Jul. 12, 2005

(54) TAILORED INDEX SINGLE MODE OPTICAL AMPLIFIERS AND DEVICES AND SYSTEMS INCLUDING SAME

(75) Inventors: Mark S. Zediker, St. Charles, MO (US); Eric E. Bott, Wildwood, MO (US); Brian O. Faircloth, Kirkwood, MO (US); John M. Haake, St. Charles, MO (US); James A. Priest, St. Charles, MO (US)

(73) Assignee: Nuvonyx, Inc., Bridgeton, MO (US)

( * ) Notice: Subject to any disclaimer, the term of this patent is extended or adjusted under 35 U.S.C. 154(b) by 0 days.

(21) Appl. No.: 10/737,127

(22) Filed: Dec. 17, 2003

(65) Prior Publication Data

US 2004/0125846 A1 Jul. 1, 2004

Related U.S. Application Data

(60) Division of application No. 09/951,778, filed on Sep. 14, 2001, which is a continuation-in-part of application No. 09/547,302, filed on Apr. 11, 2000, now Pat. No. 6,317,445.
(60) Provisional application No. 60/233,437, filed on Sep. 18, 2000, and provisional application No. 60/232,880, filed on Sep. 15, 2000.

(51) Int. Cl.[7] .............................. G02B 6/12; H01S 3/00; H01S 5/00
(52) U.S. Cl. .............................. 385/14; 385/43; 385/37; 385/129; 385/130; 385/131; 385/1; 385/2; 359/333; 372/45; 372/50
(58) Field of Search .................. 385/1–3, 14, 129–131, 385/37, 43, 45; 372/46, 45, 29, 50, 90; 359/334, 349, 333

(56) References Cited

U.S. PATENT DOCUMENTS

| | | | |
|---|---|---|---|
| 5,392,308 A | | 2/1995 | Welch et al. ................. 372/92 |
| 5,403,775 A | * | 4/1995 | Holonyak et al. ............ 438/38 |
| 5,440,576 A | * | 8/1995 | Welch et al. ................. 372/50 |
| 5,602,955 A | | 2/1997 | Haake ......................... 385/136 |
| 5,606,635 A | | 2/1997 | Haake ......................... 385/53 |
| 5,651,018 A | * | 7/1997 | Mehuys et al. ............... 372/50 |
| 5,694,408 A | * | 12/1997 | Bott et al. ..................... 372/6 |
| 5,717,516 A | * | 2/1998 | Klein et al. .................. 359/334 |
| 5,729,375 A | | 3/1998 | Klein et al. ................... 359/44 |
| 5,870,518 A | | 2/1999 | Haake et al. ................. 385/90 |

(Continued)

OTHER PUBLICATIONS

Zediker, M.S. et al., "10–amplifier Coherent Array Based on Active Integrated Optics," O.E. LASE Conference (sponsored by SPIE), Los Angeles, CA (Jan. 1990), Paper No. 1219–21.

(Continued)

Primary Examiner—Brian M. Healy
(74) Attorney, Agent, or Firm—McGinn & Gibb, PLLC

(57) ABSTRACT

A semiconductor laser device includes a tailored index single mode power amplifier. A high-power laser system can be produced by connecting several of the tailored index single mode power amplifiers in parallel. In an exemplary case, a phase shifting device can be optically coupled to each of the tailored index single mode power amplifiers; the phase shifting devices can be controlled to ensure that the laser beams output by the tailored index single mode power amplifiers are both phase aligned and wavefront matched.

39 Claims, 20 Drawing Sheets

U.S. PATENT DOCUMENTS

| | | | |
|---|---|---|---|
| 5,881,198 A | 3/1999 | Haake | 385/136 |
| 5,896,219 A | 4/1999 | Wandernoth | 359/279 |
| 6,124,663 A | 9/2000 | Haake et al. | 310/307 |
| 6,164,837 A | 12/2000 | Haake et al. | 345/8 |
| 6,229,828 B1 | 5/2001 | Sanders et al. | 372/22 |
| 6,253,011 B1 | 6/2001 | Haake | 385/52 |
| 6,256,330 B1 * | 7/2001 | LaComb | 372/46 |
| 6,280,100 B1 | 8/2001 | Haake | 385/73 |
| 6,281,997 B1 | 8/2001 | Alexander et al. | 359/130 |
| 2004/0125846 A1 * | 7/2004 | Zediker et al. | 372/50 |

OTHER PUBLICATIONS

Zediker, M.S., et al., "Design Optimization of a 10 Amplifier Coherent Array," O.E. Laser Conference (sponsored by SPIE), Los Angeles, CA (Jan., 1991), Paper No. 1418–34.

Kun H. No et al., "Monolithic Integration of an Amplifier and a Phase Modulator Fabricated in a GRINSCH–SOW Structure by Placing the Junction Below the Quantum Well," IEEE Photonics Technology Letters, vol. 5, No. 9, pp. 990–993, Sep. 1993.

* cited by examiner

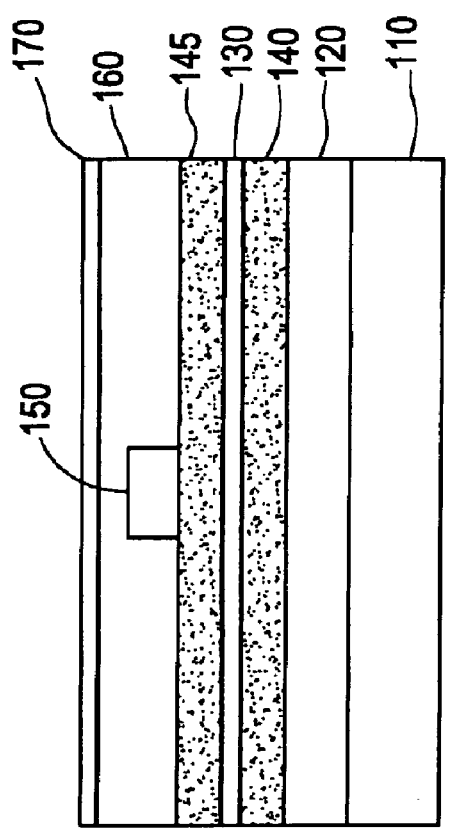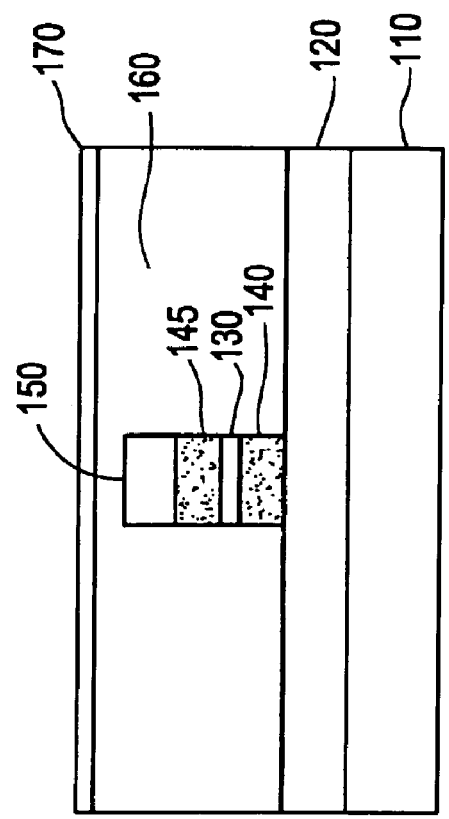

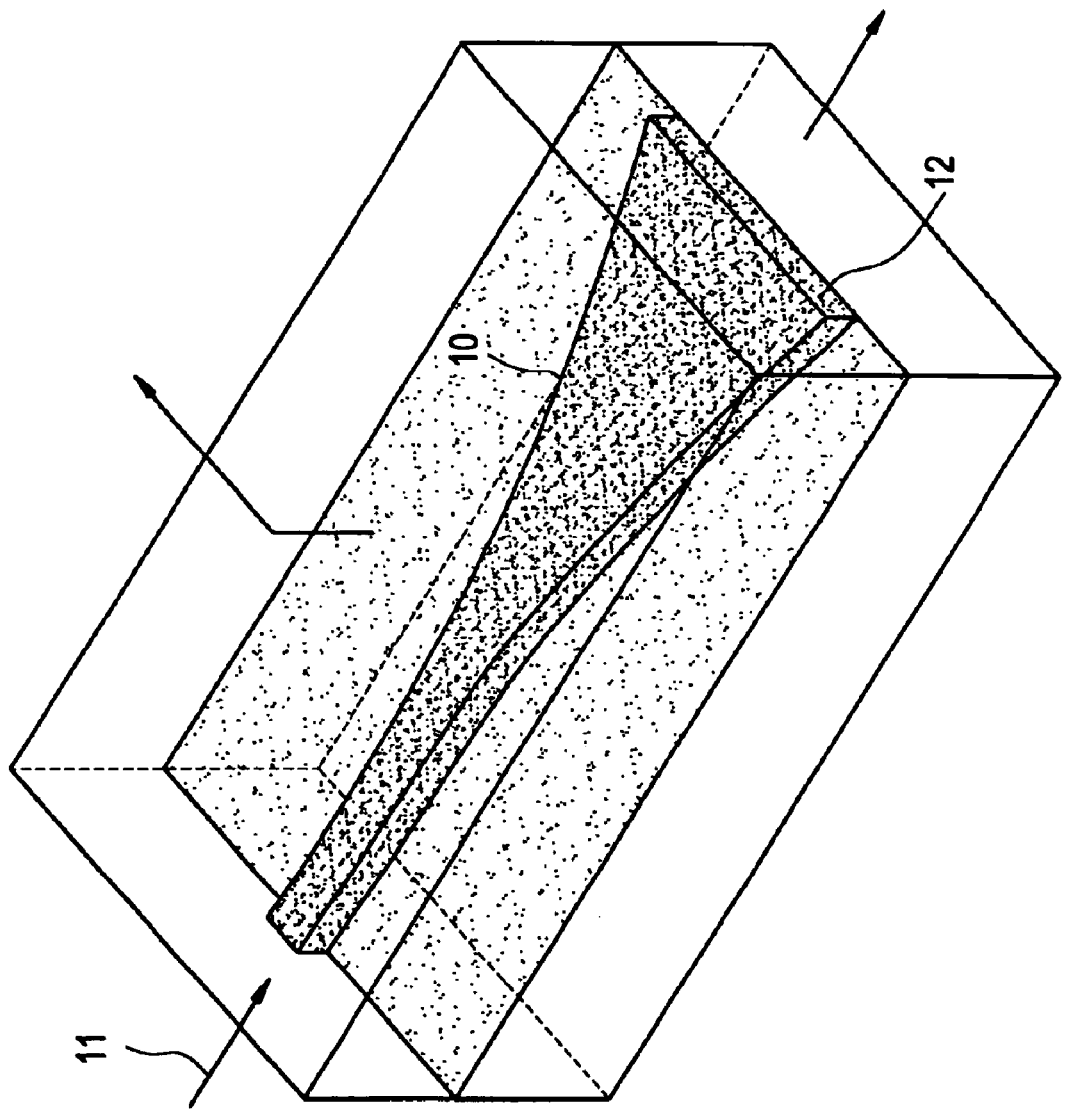

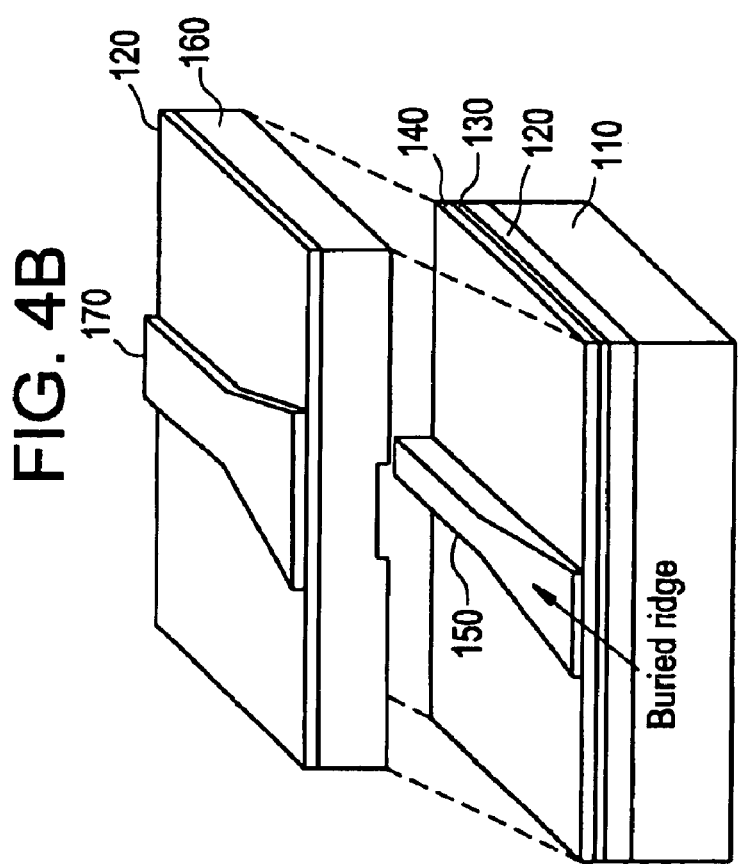
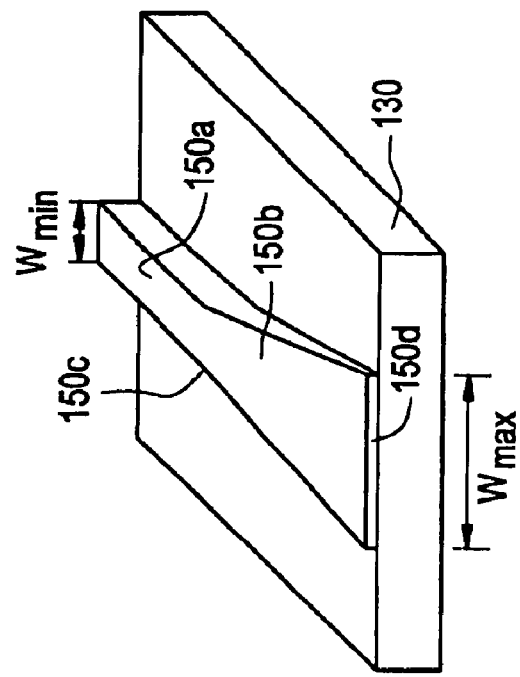

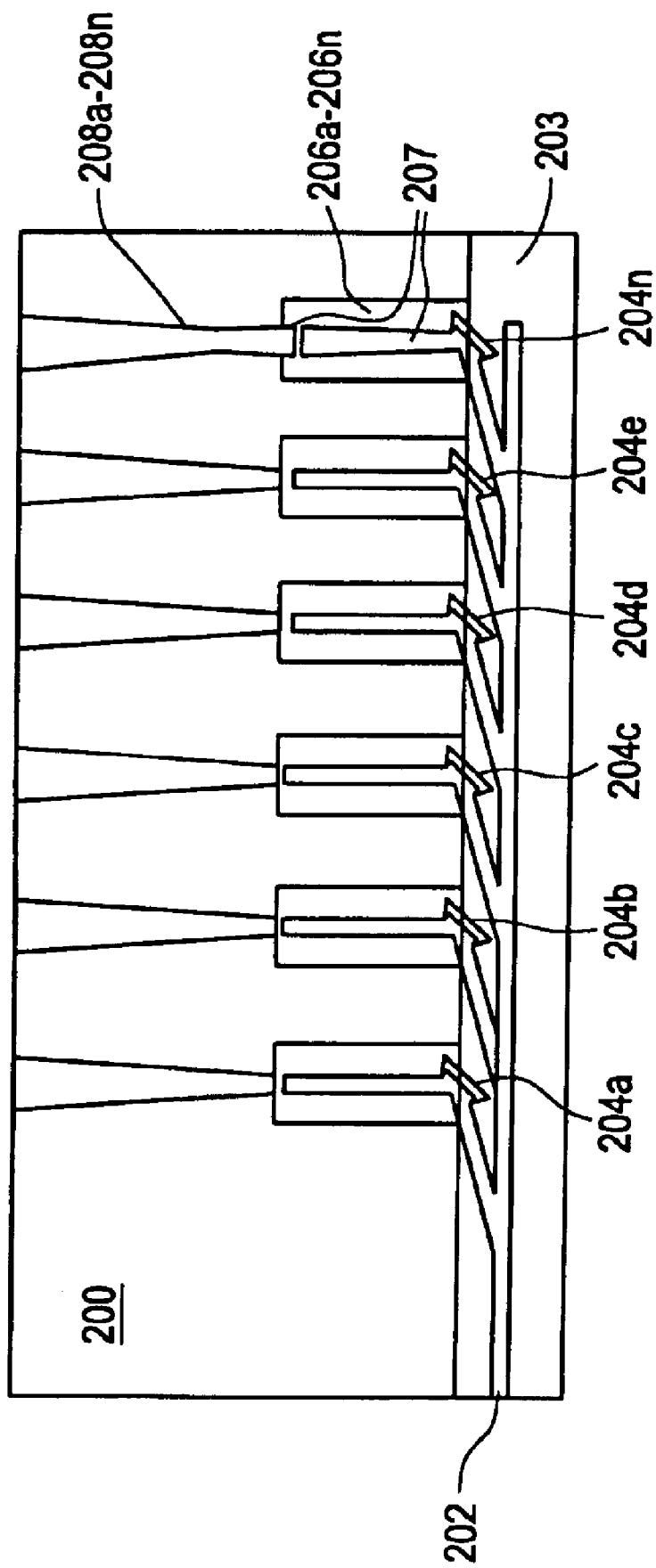

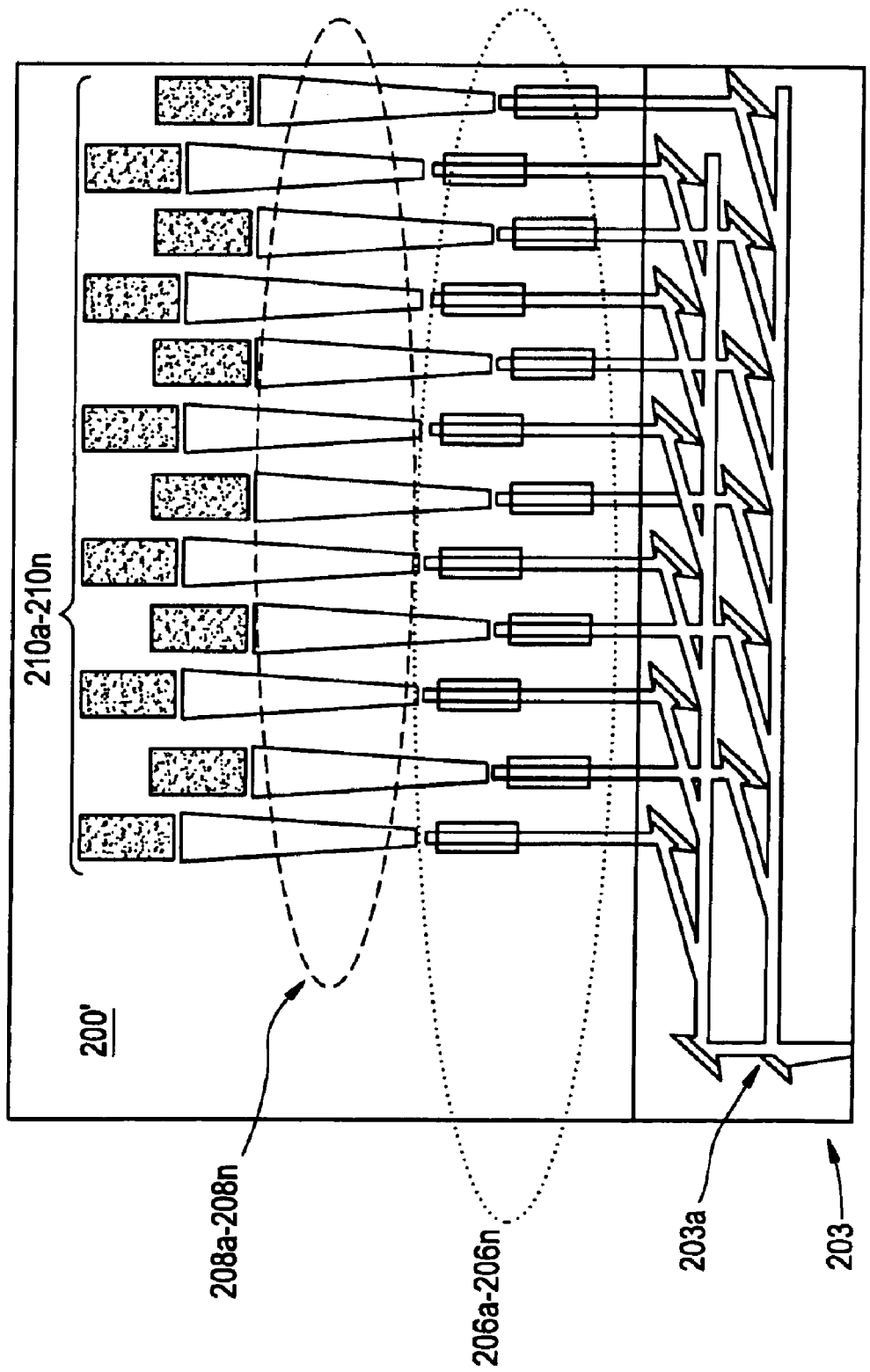

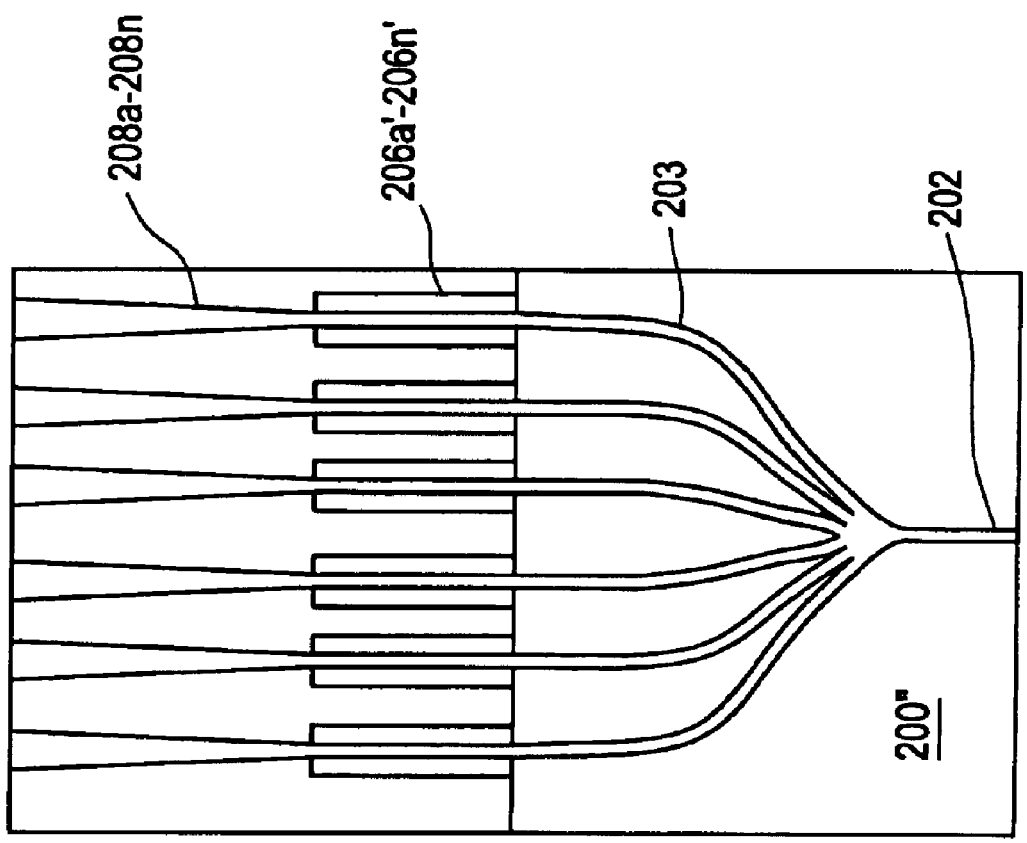

TAILORED INDEX SINGLE MODE OPTICAL AMPLIFIERS AND DEVICES AND SYSTEMS INCLUDING SAME

RELATED APPLICATIONS

The present Application is a Divisional Application of U.S. patent application Ser. No. 09/951,778 filed on Sep. 14, 2001, which is a Continuation-in-Part application of Ser. No. 09/547,302, which was filed on Apr. 11, 2000 now U.S. Pat. No. 6,317,445. The present application also claims priority from Provisional Patent Application Nos. 60/232,880 (Sep. 15, 2000) and 60/233,437 (Sep. 18, 2000). Each of these applications is incorporated herein by reference in its entirety for all purposes.

BACKGROUND OF THE INVENTION

The present invention relates generally to optical phased arrays. More specifically, the present invention relates to optical phased arrays having a tailored real index, guided amplifier structure. Advantageously, methods of fabricating an optical phased array having a tailored real index, guided amplifier structure, and systems employing the optical phased array monolithic device (e.g., a coherent chip) also disclosed.

Semiconductor lasers are the fundamental building blocks in compact optic and optoelectronics devices. Formed from Group III-V semiconductors, semiconductor lasers emit laser light in response to electrical stimulation, i.e., as electrons relax back to lower energy states, they emit photons. Stated another way, one of the most significant developments in semiconductor technology in recent years has been the increased use of III-V materials such as gallium arsenide and indium phosphide, and their ternary and quaternary alloys such as indium-gallium-arsenide-phosphide, as the active materials of semiconductor devices. The band gap characteristics of such materials typically make them candidates for optoelectronic and photonic applications such as lasers, light emitting diodes and photodetectors. For integrated circuit use, their high electron mobility often makes them preferable to the more commonly used semiconductor, silicon.

Fabrication of such devices generally requires epitaxial growth of one or more layers on a single-crystal substrate. Epitaxial growth refers to a method of depositing a material on a substrate such that the crystal structure of the deposited material effectively constitutes an extension of the crystal structure of the substrate.

The three broad classes of methods for deposition by epitaxial growth are liquid phase epitaxy, vapor phase epitaxy and molecular beam epitaxy (MBE), which respectively involve deposition from a liquid source, a vapor source and a molecular beam. One particularly promising form of vapor phase epitaxy is a method for deposition from a gas including a metalorganic compound, i.e., metalorganic chemical vapor deposition (MOCVD). MOCVD processes make use of a reactor in which a heated substrate is exposed to a gaseous metalorganic compound containing one element of the epitaxial layer to be grown and a gaseous second compound containing another element of the desired epitaxial material. For example, to grow the III-V material gallium arsenide, one may use the metalorganic gas triethylgallium [$(C_2H_5)_3Ga$] as the gallium source and arsine ($AsH_3$) as the source of the group V component, arsenic. The gas mixture is typically injected axially at the top of a vertically extending reactor in which the substrate is mounted on a susceptor that is heated by a radio-frequency coil. The gases are exhausted from a tube at the end of the reactor opposite the input end. Recently, the use of selective area growth (SAG) epitaxy, sometimes referred to as selective area epitaxy (SAE) in the manufacture of optoelectronic components has increased chip functionality by increasing the integration of more components on a single device (e.g. beam expanded laser, electromodulated lasers).

High brightness semiconductor lasers of the type discussed above are generally single mode waveguide structures that are limited to a few hundred milliwatts. It will be appreciated that higher power laser devices and systems are desirable. However, prior efforts to increase the power of conventional semiconductor laser devices via a larger gain region have met with limited success. Many tapered semiconductor laser are designed as free expansion devices in a gain guided region with no control over the position of the beam waist. In the resultant device, as the carrier concentration increases with drive current, the anti-guiding effects in the waveguide force the beam waist to shift. Many of the devices exhibit an effective shift in the direction of propagation of the beam, which makes it very difficult to match the output beam to a downstream micro-optic element. This anti-guiding effect can cause the far-field mode to increase in divergence as well as steer the beam as a function of the drive current.

In an effort to alleviate or at least mitigate the latter problem, a phased array of flared (tapered) amplifiers fed by phase adjusters and a power splitter producing a single high power beam when the flared amplifier sections are aligned and closely spaced was proposed in a paper by M. S. Zediker et al. entitled "10-Amplifier Coherent Array Based on Active Integrated Optics." In the proposed device, which is illustrated in FIG. 1, a monolithic structure 20 includes an injection port 22, for receiving a beam generated by, for example, a master oscillator (not shown), an active distribution network 24 comprising turning mirrors 24a and Y-branch sections 24b, phase modulators 26, tapered optical power amplifiers 28, and lateral beam spreading guides 30. It will be appreciated that the output of the device 20 consists of, for example, 10 beams, which can be collimated and combined by downstream optical elements (also not shown). It should be mentioned at this point that it was envisioned that all of the phase modulators will be employed to ensure that all of the output beams will be phase aligned irrespective of the optical path length associated with a respective one of the output beams. It will be appreciated that, while the paper explains some of the difficulties inherent in fabricating a phased array of flared amplifiers, particularly with respect to maintaining single mode operation in all of the amplifier regions of the device, the paper tacitly admits that a practical device was beyond the capability of existing fabrication techniques.

Other devices employing a tapered or flared amplifier, such as a master oscillator power amplifier (MOPA), which uses a distributed Bragg grating (DBG) to define a master oscillator while employing a tapered section of the waveguide as a power amplifier, have been proposed. For example, a device similar to that disclosed by the Zediker et al. paper (discussed above) is disclosed in U.S. Pat. No. 5,440,576 to Welch et al. As illustrated in FIG. 2, a monolithic device 10 includes a first portion containing a DBR master oscillator 12 having an active region for lightwave generation, which is bounded by a pair of distributed Bragg reflectors 14 and 16, receiving power via a contact 18 connected to wire 20, a second portion including a waveguide 22 and a power splitter network 24, a third portion including a plurality of phase adjusters 68, 70, 72 and 74, and a fourth portion including flared amplifiers 78, 80, 82 and 84. The '576 patent discloses that the desired "phasing" is achieved by interfering outputs of less than all of the elements in the array; each interference pattern is adjusted for maximum contrast using the phase modulator associated with a flared amplifier from which an interfering beam portion emanates.

However, in disclosing this device, the '576 patent does not specify or even address the tailored index guide requirement needed to make the taper amplifiers work effectively, particularly at high power levels. Consequently, this design has the substantial shortcomings inherent in state-of-the-art devices at the time, i.e., circa 1994. Moreover, it will be appreciated that if the tapered amplifiers employed in the Welch et al. device have a constant index step, then the output power will be limited by the inability to maintain the single mode characteristics over the entire length of the taper. This would force the designer to either underconfine the mode in the narrow sections, or loosely confine the mode in the wider sections. If the mode is underconfined, then the propagation losses will be substantial and the power that reaches the power amplifier section will be insufficient to generate the desired output power. If the mode is loosely confined, then the anti-guide effects will be important, and the beam waist and far-field profile will be affected in the manner described above.

It should be mentioned here that all of the papers and patents mentioned herein are incorporated by reference. In particular, each of the patents mentioned by number is incorporated herein by reference in its entirety.

Accordingly, there is a need for an improved semiconductor amplifier structure. Stated another way, what is needed is a method for fabricating a tapered power amplifier having a corresponding tailored index profile suitable for ensuring single mode operation, and a stable beam waist and astigmatism over a broad range of drive currents. What is also needed is an optical phased array device having such a tailored index guided tapered amplifier structure. It would be beneficial if the device including an optical phased array having a tailored index guided tapered amplifier structure could be employed in an optical amplifier allowing signals from many tapered amplifiers to be coherently combined on a single optical fiber. It would be beneficial if the device including an optical phased array having a tailored index guided tapered amplifier structure permit coherent combination and steering of a far-field beam of advantageous profile through either a clear medium or a phase corrupting medium. Moreover, what is needed is an optical amplifier that minimizes the number of lossy elements employed in the network while minimizing the loss of signal-to-noise ratio through the device. Furthermore, it would be beneficial if the optical amplifier could be injection locked to a common optical signal with a plurality of other similar optical amplifiers, and arbitrarily phased to the optical signal such that the output beams from all of optical amplifiers advantageously can be coherently combined to form a far-field beam of advantageous shape even in the presence of an inhomogeneous index medium such as long paths through the atmosphere.

SUMMARY OF THE INVENTION

Based on the above and foregoing, it can be appreciated that there presently exists a need in the art for an optical phased array incorporating an index guided tapered amplifier structure which overcomes the above-described deficiencies. The present invention was motivated by a desire to overcome the drawbacks and shortcomings of the presently available technology, and thereby fulfill this need in the art.

According to one aspect, the present invention provides a semiconductor device having at least one tailored index single mode optical power amplifier. If desired, the tailored index is produced by tailoring a current profile applied to the amplifier along at least the optical axis of the semiconductor laser device. Alternatively, the tailored index associated with the power amplifier is produced by varying the thermal impedance characteristic at the junction between the power amplifier and a supporting heatsink. In another exemplary embodiment, the tailored index associated with the power amplifier is provided by implantation of impurities in the amplifier structure. Beneficially, the tailored index associated with the power amplifier can also be provided by implanting impurities in regions of the semiconductor laser device adjacent to the amplifier structure. The tailored index associated with the power amplifier can be produced by varying the height of the buried rib along the optical axis as the width varies from a first to a second predetermined value. Finally, the tailored index associated with the power amplifier can be produced by a number of discrete, effective index steps that collectively form the desired tailored index profile.

According to another aspect, a semiconductor laser device includes an optical phased array having N power amplifiers connected in parallel, wherein each of the N power amplifiers is a tailored index guided single mode power amplifier; and N is an integer greater than or equal to 2.

According to yet another aspect, the present invention provides an integrated semiconductor laser device, which generates N phase aligned, wavefront matched laser beams from N amplified laser signals. Preferably, the integrated semiconductor laser device includes N (N−1) phase modulators receiving an input beam from a master oscillator and generating N (N−1) phase shifted laser signals (and a reference signal); N tailored index single mode power amplifiers receiving the N (N−1) phase shifted laser signals (and the reference signal) and generating the N amplified laser beams. Another aspect of the present invention provides for the packaging of the integrated semiconductor device with a phase sensor generating N (N−1) sensor signals indicative of the phase of the individual N (N−1) amplified laser beams; and a controller for controlling the phase of each of the N (N−1) amplified laser beams responsive to the N (N−1) sensor signals, respectively, to thereby generate the N phase aligned, wavefront matched laser beams. In an exemplary embodiment, N is any positive integer.

According to a further aspect, the present invention provides a semiconductor laser system including:

N tailored index single mode power amplifiers, N being any positive integer;

N (N−1) phase modulators optically coupled to the input ports of the N tailored index single mode power amplifiers;

an optical device which launches the output of the N tailored index single mode power amplifiers into an optical fiber to thereby generate N coherent beams;

a phase sensor for generating respective electrical signals indicative of phase and wavefront characteristic each of the N coherent beams; and a controller electrically coupled to the N (N−1) phase modulators for permitting the N phase modulators to match the phase and wavefront of the N coherent beams to one another.

Alternatively, the phase control of the chip can be accomplished by monitoring the power captured in the central lobe of the far-field of the phased array. This far-field is generated either at the focal point of a lens, or by placing a detector at least one Raleigh range away from the chip, where the Raleigh range is determined with respect to the phase aligned chip and not the individual emitters. The feedback signal needed for phase control of the chip(s) can be derived by a digital (or analog) phase check on each emitter, which translates to a change in intensity in the main lobe of the far-field as well as the side lobes in the far-field. As optimum phase alignment is achieved, the on-axis main lobe is maximized and the off-axis side-lobes are minimized. It should be mentioned that the off-axis side-lobes are best suited to achieving near ideal phase alignment because of the substantially enhanced signal-to-noise ratio (SNR) of the phase dither compared to the dither signal associated with the on-axis lobe.

BRIEF DESCRIPTION OF THE DRAWINGS

These and various other features and aspects of the present invention will be readily understood with reference to the following detailed description taken in conjunction with the accompanying drawings, in which like or similar numbers are used throughout, and in which:

FIGS. 3A, 3B, 3C, and 3D illustrate various layer arrangements, which advantageously can be employed in the construction of monolithic structures such as laser diodes;

FIGS. 4A, 4B, 4C, 4D, 4E, 4F, 4G, and 4H illustrate various aspects regarding the construction and of single and multiple tapered amplifier structures according to the present invention;

FIGS. 5A and 5B illustrate first and second preferred configurations of an optical phased array having an index guided tapered amplifier structure according to the present invention;

FIG. 6 illustrates an alternative configuration of an optical phased array having an index guided tapered amplifier structure according to the present invention;

DETAILED DESCRIPTION OF THE PREFERRED EMBODIMENTS

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
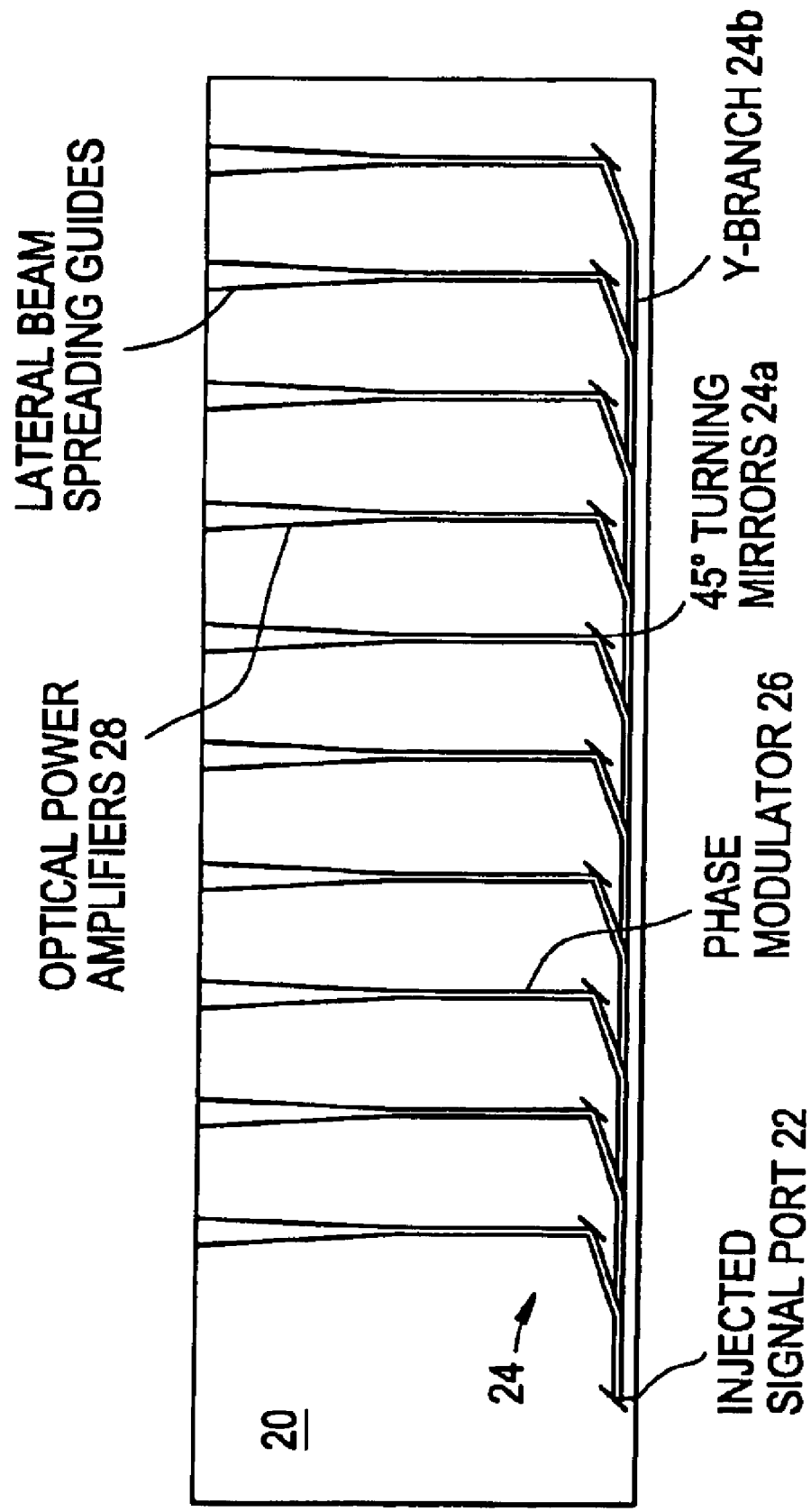
FIG. 1 illustrates a proposed optical phased array amplifier.
Figure 2:
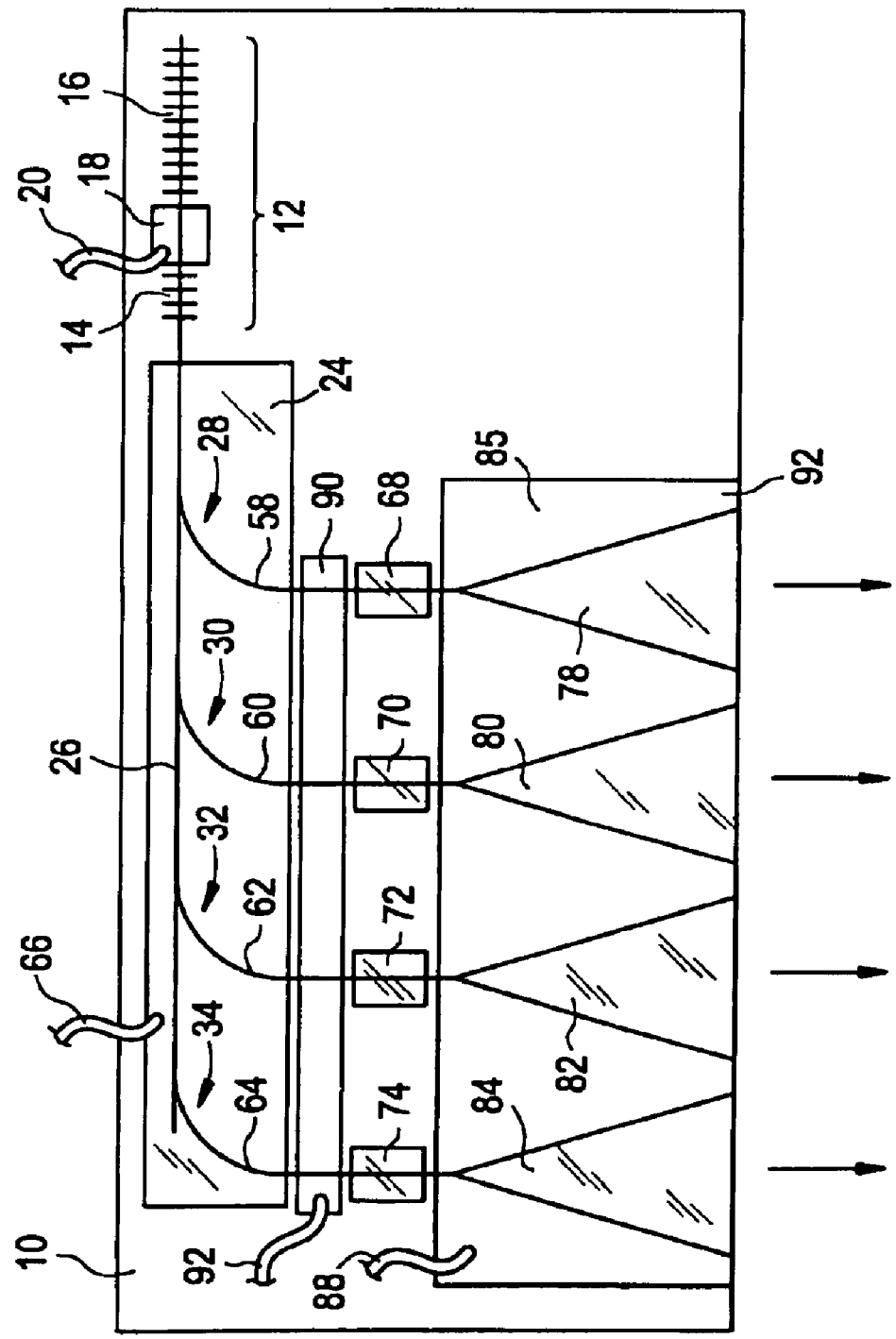
FIG. 2 illustrates a typical master oscillator power amplifier (MOPA) employing an optical phased array similar to that depicted in FIG. 1
Figure 3A:
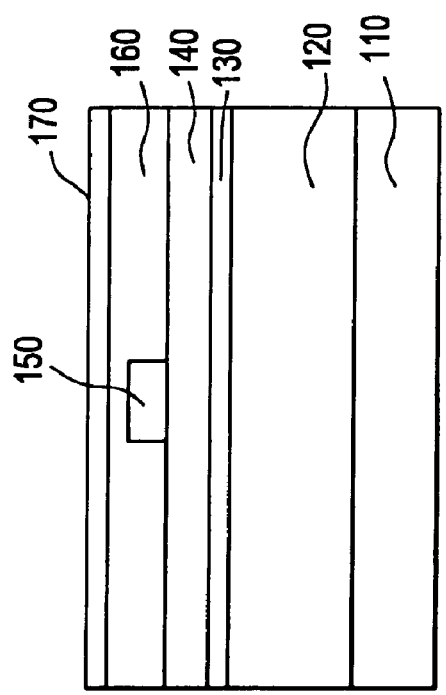
Figure 3B:
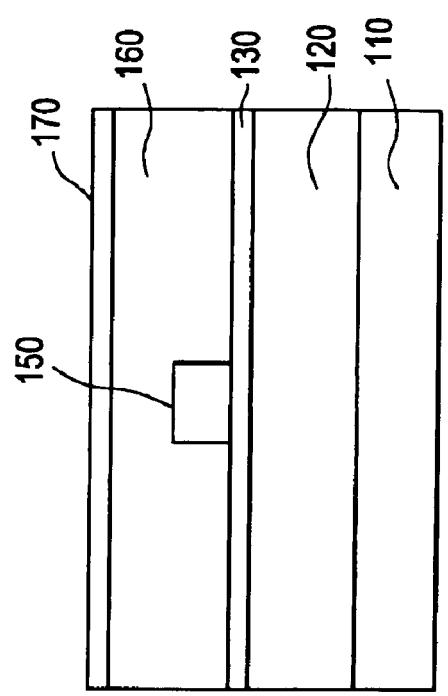

It will be appreciated that the monolithic devices such as those illustrated in FIGS. 1 and 2 can have the cross section illustrated in either FIG. 3A or FIG. 3B. Thus, an optical waveguide advantageously can include a substrate 110, which is suitable for selective area epitaxy (SAE) laser device growth, above which is disposed a lower wide-gap transverse waveguide outer confining layer 120, followed by a composite active region 130, which typically consists of a quantum well or wells and appropriate inner barrier layers. The two layers 140 and 160 disposed above the quantum well layer serve as the upper wide-gap transverse waveguide outer confining layer. It will be appreciated that the layers 140 and 160 may have either similar or dissimilar material compositions, depending on a number of design factors well understood by one of ordinary skill in this particular art. A contact layer 170 typically is a heavily-doped narrow gap layer suitable for formation of high quality ohmic contacts. A rib element 150 is disposed between the layers 140 and 160.

It will be noted that the selectively grown or etched rib structure 150 is designed to have a narrower bandgap than the confining layers 120, 140 and 160, thus, a higher refractive index. Tailoring dimensions of the rib layer 150, such as the thickness, width, and separation and composition can be used to raise the effective refractive index in the central, or core, region, resulting in a latent slab dielectric waveguide.

It will also be noted that the configuration illustrated in FIG. 3B is similar to that illustrated in FIG. 3A but for the thickness of the confining layer 140. In FIG. 3B, the confining layer 140 has a zero thickness, i.e., it is omitted; thus, the rib structure 150 is disposed immediately adjacent to the quantum well layer 130. It should be noted that the Zediker et al. paper mentioned above discussed the need for controlling the spacing between the rib element 150 and the active (quantum well) layer 130.

Other configurations are possible. For example, as illustrated in FIG. 3C, the monolithic device can be constructed as follows. The monolithic structure includes a N-type GaAs substrate layer 110, a N-type cladding layer 120, an N-type waveguide layer 140, an active (quantum well) layer 130, a P-type waveguide layer 145, a rib layer 150, a P-type cladding layer 160, and a P-type cap layer 170, arranged in the stated order. In contrast, FIG. 3D illustrates a heterostructure device, which is fabricated with a N-type GaAs substrate layer 110, a N-type cladding layer 120, a rib structure including an N-type waveguide layer 140, an active (quantum well) layer 130, a P-type waveguide layer 145, a rib layer 150, which rib structure is covered with both a P-type cladding layer 160 and a P-type cap layer 170.

As previously mentioned, the use of selective area growth (SAG) epitaxy or selective area epitaxy (SAE) in the manufacture of optoelectronic components has increased chip functionality by increasing the integration of more components on a single device. The one distinction that must be made is that the SAG Epitaxy employed in fabricated preferred embodiments according to the present invention refers to the growth through a mask that does not necessarily refer to the desired thickness variance in the grown areas that are required in these design. This growth through a mask can be performed with virtually any of the growth methods listed above. The SAE process takes advantage of the limited diffusion length of the gas borne species in the MOCVD technique to produce an enhanced growth rate in the unmasked crystal surface. This enhanced growth rate is achieved through the careful design of the mask to force the gas borne species to diffuse to the exposed crystal surface at a higher rate than in the areas that are widely exposed. As a consequence, narrow unmasked regions advantageously can be forced to grow at a faster rate than wider unmasked regions and produce the desired tailored rib profile, which profile is necessary to produce the tailored index profile in exemplary embodiments of the present invention.

It should be mentioned at this point that all of the structures illustrated in FIGS. 3A–3D advantageously can be formed by one or more epitaxial growth processes. For example, the structure illustrated in FIG. 3C can be fabricated using MOCVD to grow entire structure; alternatively, MBE can be used to grow up to the p-waveguide layer 145 followed by MOCVD Selective Area Epitaxial (SAE) growth of rib 150 and overgrowth of p-clad and p-cap layers 160 and 170. Moreover, with respect to FIG. 3D, either MOCVD or MBE processes can be employed to grow all of the layers followed by patterned etching to create the desired trench structure followed by SAE-MOCVD growth to create the proper rib feature followed by MOCVD overgrowth over entire structure to bury it. Alternatively, the MBE process can be employed during layer growth through a mask followed by SAE-MOCVD growth to create the proper rib feature, followed by MOCVD overgrowth over entire structure to bury it. The processes employed in generating structures such as tapered amplifier devices employing the layer arrangements illustrated in FIGS. 3A and 3b will be discussed in greater detail immediately below.

It will be appreciated that tapered waveguide structures have been successful in extending power output of these devices to a few watts. See U.S. Pat. No. 5,440,576 to Welch et al., which was discussed in detail above. In contrast, U.S. Pat. No. 5,896,219 to Wandernoth discloses another optical semiconductor amplifier with an integral optical waveguide 180, i.e., a single tapered amplifier whose lateral extension increases over its length. Light guided in an optical inlet 181 undergoes amplification on the way to the optical outlet 182 by means of stimulated emission of light in a distributed semiconductor junction, which has been inserted into the optical waveguide 180 and is pumped with electrical current, wherein, because of the lateral extension of the optical waveguide 180, a small change results in the intensity of the amplified light in comparison to the light present at the optical inlet 181. The required feed current furthermore flows with homogeneous current density in the semiconductor junction, which is congruent with the optical waveguide 180. See FIG. 4A. It will be noted that the "tapered" amplifiers proposed in the above-mentioned patents are "tapered" one dimensionally, i.e., the width varies along the optical axis of the amplifier.

One of the novel features of one preferred embodiment of the optical phased array according to the present invention is that the geometry of the rib layer 150 is controlled to provide a true "tailored index" waveguide (amplifier) section. As seen in FIGS. 4B and 4C, the rib layer 150 includes a flared or tapered portion 150b, which extends from a uniform cross-section portion 150c to a wide end 150d of the rib layer 150, which has a much reduced thickness. It will be appreciated that the portion 150b advantageously can be coupled to a portion 150a, which can be one of a waveguide or an active control device, as discussed in greater detail below. It should be mentioned that the active layer 130 containing one of more quantum wells is disposed beneath both portions 150a and 150b of rib 150; it will be appreciated that the quantum well adjacent to portion 150a need not be the same quantum well adjacent to portion 150b. It will be noted from FIG. 4C that the lengths of portions 150a and 150b are $L_a$ and $L_b$, respectively, while the rib 150 varies between minimum and maximum widths $W_{min}$ and $W_{max}$, respectively. Exemplary dimensions are included in the discussion below.

It should be mentioned at this point that many people have tried to fabricate real index guided power amplifiers; see U.S. Pat. Nos. 5,440,576 and 5,896,219. The fundamental error in all of these devices is that the index step along the waveguide does not vary (i.e., is not tailored) and, as a consequence, these devices do not provide a sufficiently stable output beam, particularly at relatively high power levels, i.e., greater than 0.5 watts. It is essential that the index step be tailored, as mentioned in the parent application, in order to ensure that single mode operation can be maintained when the device is operated at high power levels. Thus, the device disclosed in the '219 patent, while it can be said to disclose a real index guided device, is not the "tailored index" single mode device described herein. The physics behind the "tailored index" single mode amplifier according to the present invention as follows. A waveguide of a given lateral width will only be single mode if the index step, i.e., the difference in index from inside of the waveguide to the outside, stays below a given value, i.e., maintains a predetermined ratio between waveguide width and height. As the width of the waveguide expands (contracts), the index step has to decrease (increase) in order to maintain single mode operation. If the index step is a constant, as shown in U.S. Pat. No. 5,896,219, then the index step will be either too large in the wider section, thus leading to multi-mode operation, or too small in the narrow section, leading to low efficiency, unconfined power propagation.

It should be noted that the actual shape of the flare or tapered portion 150b advantageously can take a number of different forms including linear, exponential, raised-cosine, etc. In any event, it will be appreciated that the relationship between the thickness and width of the flare at any point must be maintained such that the waveguide only supports the fundamental lateral optical waveguide mode. Though a single end of the waveguide is shown as being wide and uniformly thin, it should be mentioned that the invention is also realized with two flared ends and a central region of generally uniform width and thickness.

The basic flared and tapered waveguide structure with a tailored index according to one aspect of the present invention advantageously can be incorporated in any semiconductor laser irrespective of the materials or structure of the active region. The following discussion regarding fabrication of such structures is, of necessity, merely exemplary; it concerns the semiconductor laser structures illustrated in FIGS. 4A, 4B, 4C, and 4H (discussed below).

The preferred method for fabricating the semiconductor laser having such structures in FIGS. 4A, 4B, 4C, and 4H is the above-mentioned selective area epitaxial (SAE)

MOCVD growth process utilizing a flared/tapered mask geometry to obtain an appropriate complementary relationship between the thickness of an active region transverse to the axis of the waveguide geometry, or the thickness of a rib-loaded waveguide geometry, and the varying lateral width of the waveguide such that the fundamental spatial mode of operation of a semiconductor laser is maintained throughout the waveguide. As mentioned briefly above, SAE-MOCVD results when a dielectric mask is utilized for growth inhibition in the masked regions. More specifically, since most of the materials associated with MOCVD growth will not adhere to, or grow on, a dielectric mask, these materials will diffuse on the surface, or in the gas phase, away from the masked regions and into the unmasked regions. As a result, no growth occurs in masked regions and a corresponding, predictable increase in the thickness of selectively grown layers is observed in any unmasked regions in the vicinity of the dielectric mask.

Figure 4D:
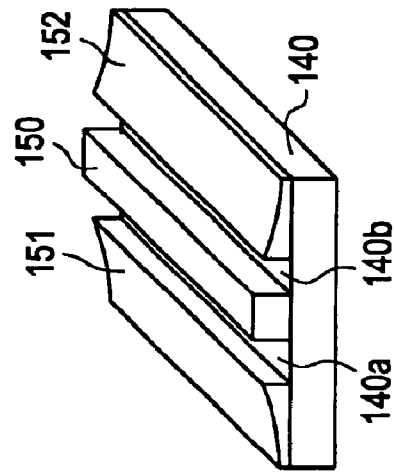
Figure 4E:
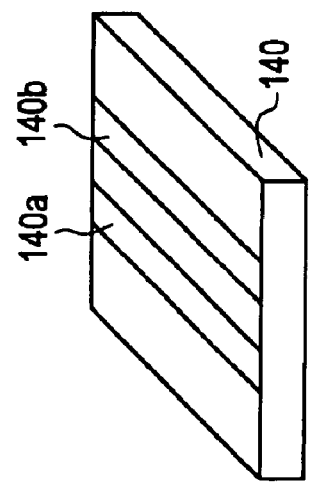

In the simplest case, the dual stripe mask pattern 140a, 140b illustrated in FIG. 4D advantageously can be utilized with substrate (layer) 140, which substrate (layer) is suitable for selective area epitaxial growth. It will be appreciated from FIG. 4E that the dielectric mask (140a, 140b) produces two beneficial results. First, there is no epitaxial material grown above the masked regions; this allows the diode laser designer to utilize the width of the opening between the masked regions to define the width of the laser lateral waveguide, i.e., the core of the lateral waveguide. Second, the growth rate in the opening between the masked regions depends on both the supply rate of growth constituents and the width of the mask stripes; the growth rate is at a maximum in the open region between the mask stripes 140a, 140b. The result is shown in FIG. 4E, where the rib 150 exhibits an enhanced growth rate in the open area between the dielectric mask stripes 140a, 140b, in contrast to the growth structures 151 and 152, which were grown outside of the dielectric mask and which exhibit diminished growth the greater the distance from the center of the dielectric mask 140a, 140b.

Figure 4F:
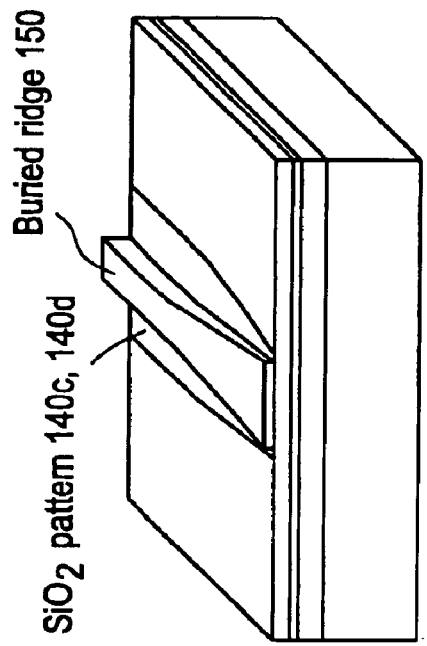
Figure 4G:
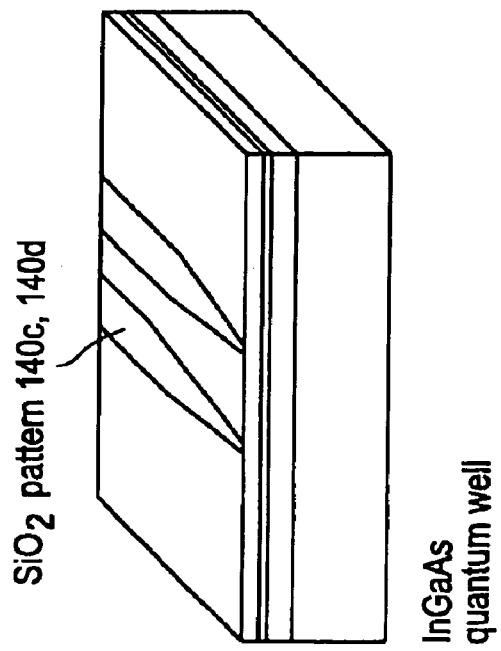

Thus, selective MOCVD allows the designer to choose any layer thickness, within limits, for the central part of the structure. This permits the designer to select and fabricate a predetermined refractive index step between the core of the lateral waveguide and the surrounding regions. In fabrication of a semiconductor laser according to one aspect of the present invention, the dielectric mask advantageously includes two flared stripe-shaped films 140c and 140d, having an opening width at the narrow end of $W_{min}$, which increases over the desired length $L_b$ to an opening width at the wide end of $W_{max}$, as illustrated in FIG. 4F. It will be appreciated that, in an exemplary case, the flared rib 150 must get thinner as the flare, i.e., portion 150b, becomes wider. In order to produce this effect, the width of the dielectric stripes 140c, 140d are varied, become narrower, as the flare gets wider. See FIG. 4G.

Figure 4H:
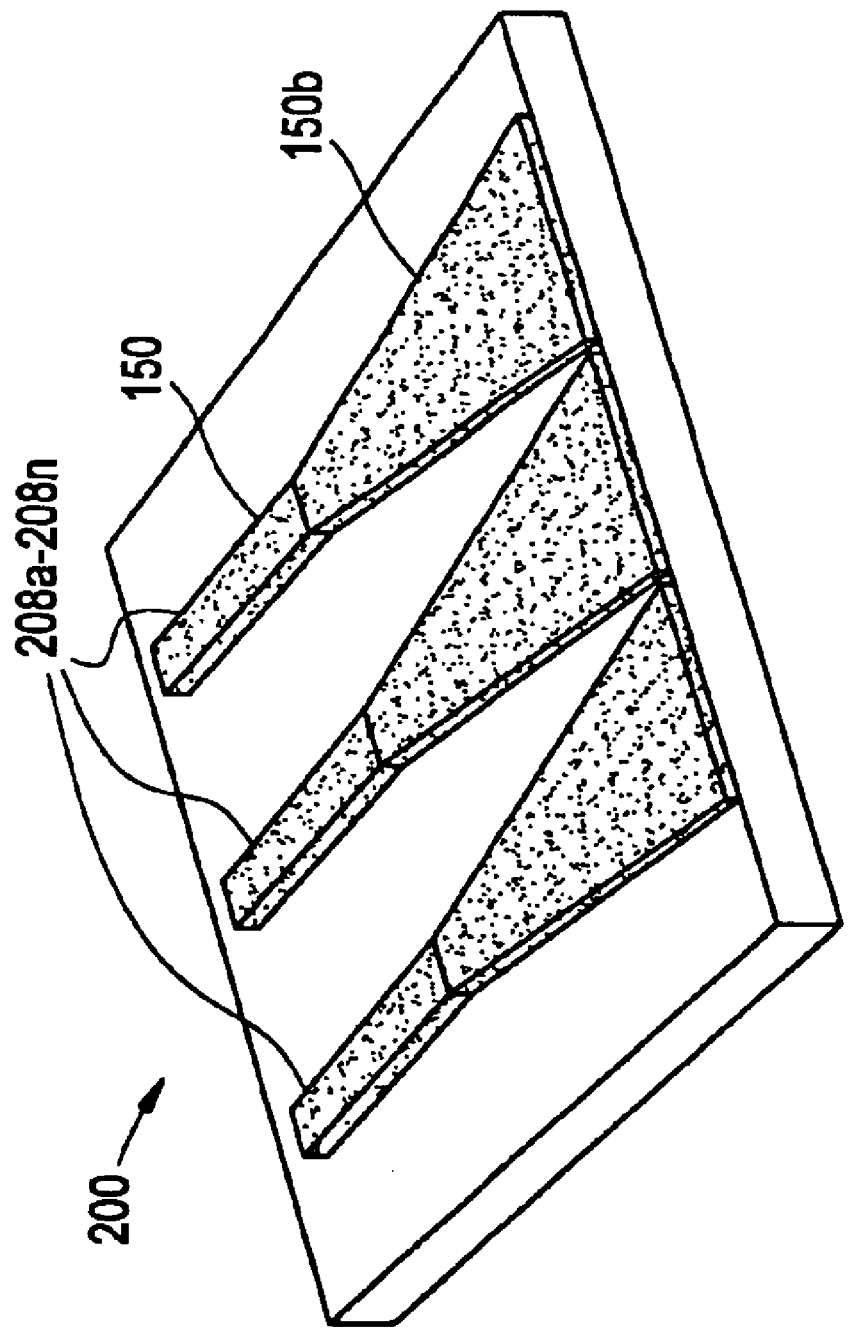

It will be appreciated that this is an exemplary case regarding the specific structure illustrated in, for example, FIG. 4C. The present invention is not so limited. Other variations and improvements on the devices illustrated and processes discussed will occur to one of ordinary skill in the art after reading the instant disclosure; all such variations and improvements are considered to be within the scope of the present invention. Moreover, it will be appreciated that while the discussion immediately above was limited to single tapered amplifier structures providing a tailored index step, multiple tapered amplifiers, such as illustrated in FIG. 4H, advantageously can be fabricated on a single substrate.

Thus, the tailored index guided amplifier according to another aspect of the present invention can include N such amplifiers, where N can be any positive integer.

FIG. 5A illustrates a first preferred configuration, i.e., a linear array, of an optical phased array 200 having a tailored index single mode tapered amplifier structure according to the present invention while FIG. 5B illustrates a second preferred configuration, i.e., a two-dimensional planar array of an optical phased array 200'; FIG. 6 illustrates an alternative configuration of an optical phased array 200" shown in FIG. 5A. It will be appreciated that all of the exemplary, and non-limiting, embodiments include an input port 202 for accepting the output of a master oscillator (MO (not shown), a plurality of turning mirrors 204a–204n disposed in optical distribution network 203 optically coupling the port 202 to a plurality of individually controllable phase modulators 206a–206n (206a'–206n'), and a plurality of real index guided power amplifier sections 208a–208n, disposed downstream of phase modulators 206a–206n (206a'–206n'), respectively. Optionally, the optical phased array illustrated in FIG. 5B can include tapered waveguides 207, each having a tailored index that can be used in minimizing misalignments between two integrated optical components, e.g., the phase modulators 206 and a tailored index single mode optical amplifier 208, on the array 200'.

Preferably, all of the optical elements discussed above are optically coupled to one another in the recited order by optical waveguides, which can be either integrally formed or separately fabricated. It should be mentioned that all of the phase modulators (206a–206n and 206a'–206n') are capable of generating a 2□□phase shift, which is all that is required for the designs in both FIGS. 5 and 6. While FIG. 5 has more temporal phase delay across the optical phased array chip than that of the array illustrated in FIG. 6, as long as this phase delay is less than the coherence length of the master oscillator, each emitter can be adjusted to a modulo 2□ relative phase setting to form the proper outgoing wavefront.

It will be noted that the turning mirrors 204a–204n illustrated in FIGS. 5A and 5B are conventional total internal reflection turning mirrors while the turning mirrors illustrated in FIG. 6 advantageously can be grazing incidence total internal reflection turning mirrors 204a'–204n'. The turning mirrors in the optical phased array 200' can be replaced and/or supplemented by various additional optical elements including, but certainly not limited to, curved waveguides and diffractive gratings where the individual lobes generated by the diffraction grating can distribute the power to the individual waveguide either within the epitaxial layers of the device or for free-space lateral transmission of power (not shown individually). It should be mentioned that the optical distribution network 203, including the turning mirrors 204a–204n, advantageously can be an active distribution system, i.e., the optical losses normally associated with a passive distribution system can be negated by the optical gain associated with the various optical channels.

Figure 7B:
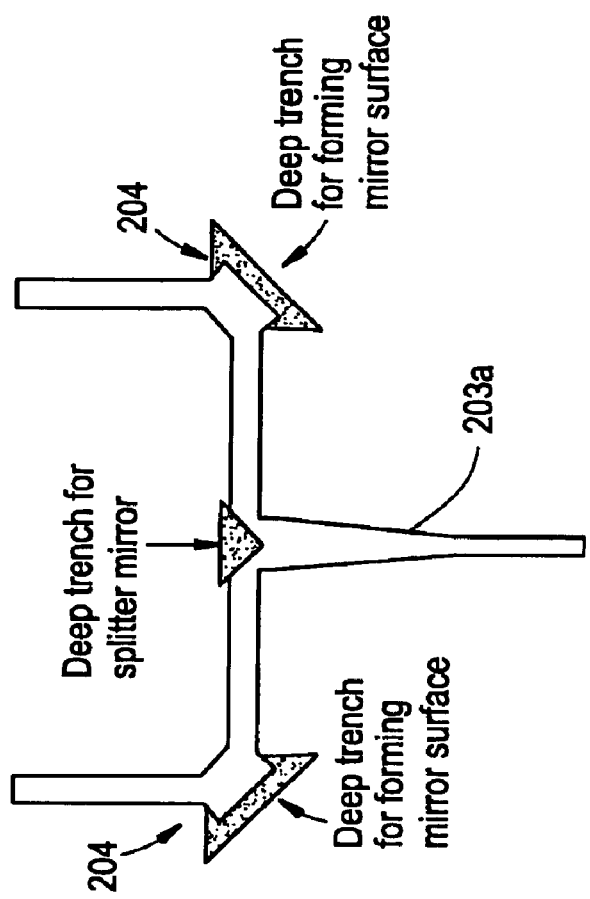
FIGS. 7A and 7B illustrate alternative formations of a turning mirror applicable to both deep trench and surface waveguides employable in the optical phased arrays depicted in FIGS. 5A, 5B, and 6.

It will be noted that the device 200' illustrated in FIG. 5B advantageously optical elements 210a–210n. Preferably, these (passive) optical elements are turning mirrors, although diffraction grating could also be employed. It will be noted that the use of optical elements 210a–210n may require that the chip 200' be mounted p-side up unless the optical coupling is out through the substrate, which is transparent to this wavelength. In addition, it should be noted that the distribution network 203' in FIG. 5B includes at least one stress induced index guided optical element 203a, which, as illustrated in FIG. 7B and as discussed in greater below, forces the mode into two divided lobes.

In the exemplary cases illustrated in FIGS. 5A, 5B, and 6, the tailored index single mode power amplifier sections 208a–208n are tapered power amplifier sections. It will be appreciated that the tailored index single mode power amplifier stages need not be "tapered," in the sense illustrated in FIGS. 4H, 5 and 6; the essential feature required to make the optical phased array 200, 200', 200" work is the tailored index guide in the expanding amplifier region which maintains single mode operation along the entire length of the expanding amplifier.

It will be appreciated that one of ordinary skill in the art will immediately perceive that there are numerous methods by which the real or tailored, e.g., tapered, index guided amplifier advantageously can be fabricated. Exemplary methods that can be employed to fabricate the device illustrated in FIGS. 5A, 5B, and 6 include:

1) Selective area epitaxy (SAE) which, as explained in detail above, can be utilized in producing a continuous taper in the index profile of a buried rib structure. It should be mentioned that this particular structure is disclosed and illustrated both in the instant application and the parent application;
2) Surface rib or buried rib—using a non-planar photoresist pattern, it is possible to program the erosion rate of the mask during the etch process to reduce the depth of the etch either piecewise or continuously along the expanding rib. This produces the same effect as the buried rib structure in that the index step decreases as the mode expands. See FIG. 4H;
3) Current Profiling—tailor the index step by the distribution of the current to the device;
4) Thermal Impedance Profiling—tailor the index step by changing the characteristics of the thermal impedance between the junction and the heatsink; and
5) Impurity Profiling—the index step advantageously can be controlled by implanting or impurity induced disordering of adjacent regions.

It will be appreciated that the tailored index guided amplifier structure employed in the preferred embodiments of the present invention advantageously can utilize more than one of the above-mentioned fabrication, i.e., profiling, techniques simultaneously in order to produce the desired, tailored index guided amplifier structure.

Taking the elements illustrated in FIGS. 5A, 5B, and 6 and discussing them in order would facilitate an understanding of the optical phased array 200, 200' having a tailored index single mode amplifier (208, 208') structure according to one aspect of the present invention. Before discussing the elements themselves, it would probably be useful to discuss the characteristics of the master oscillator.

The master oscillator (MO) that advantageously can be employed with the present invention is preferably a real index guided device having sufficient coherence length to meet the requirements of the optical phased array according the illustrated embodiments of the invention depicted in FIGS. 5 and 6 (discussed above) and 8 (discussed below). It will be appreciated that the laser beam generated by a master oscillator having the desired coherence length advantageously can be launched into either linear phased arrays or two-dimensional phased arrays.

It should be mentioned that a fiber grating can be attached to the input port 202 of the chip 200. 200' and serve as a wavelength selection element; this would allow the chip 200, 200' to oscillate in a single axial mode. It will be appreciated that this would be suitable for single chip applications. Alternatively, a Distributed Bragg Reflector based master oscillator can be integrated into the device to provide a frequency-controlled output. See U.S. Pat. No. 5,440,576 to Welch et al.

Figure 7A:
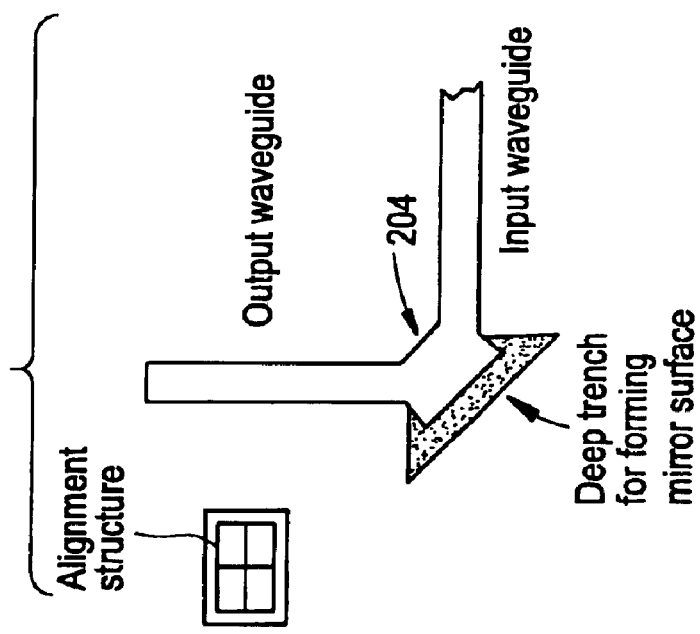

FIGS. 7A and 7B illustrate certain aspects of the techniques employed in fabricating one of a deep trench turning mirrors 204a–204n applicable to buried rib waveguides and turning mirror for surface rib waveguides. It should be noted that surface ribs are preferred, since the turning mirrors can be self-aligned to rib structure. In other words, buried ribs require alignment marks to insure alignment to waveguide structure. For example, FIG. 7A illustrates an alignment structure created during buried rib growth, which is employed as reference for deep etch after p-cap growth. It should be noted that a tailored index guide could be advantageous when interfacing to a turning mirror, because a lower divergence beam with greater alignment tolerance can be realized with the tailor index structure than can be realized with the surface rib. In FIG. 7B, a stress index guided optical element 203a is disposed upstream of multiple turning mirrors, generally denoted 204, when it is beneficial for the index characteristic to split the mode laterally into two parallel modes just before the split.

With respect to the phase modulators illustrated in FIGS. 5 and 6, the phase modulators 206a–206n (206a'–206n') advantageously can employ any one of several well-known phase controlling techniques including:

1) Thermal Effect—A forward bias can be used to modulate the phase of the individual emitters on the device. Thermal effects are due to the high dispersion of GaAs. As large currents are passed through the junction, it heats up and changes the phase. While thermal effect phase control has several disadvantages, i.e., the control process is slow, has multiple frequency response poles, and causes a significant amplitude modulation, it can be used in this application successfully.
2) Electro-Optic Effect—Both linear and higher order electro-optic effects can be used to induce significant phase changes. However, in order to produce this effect, it is necessary to apply a high electric field across the junction and consequently the quantum well. The net result is the band edge is modulated about the operating wavelength and, consequently, the output amplitude is significantly modulated. This method can be used, although it may be difficult to differentiate between amplitude modulation induced by the phase modulator and the amplitude modulation induced by the interference of emitters. It should be mentioned that SAE techniques could be used to selectively grow a different quantum well structure, i.e., one allowing the electro-optic effect to be used without the associated amplitude modulation effects.
3) Carrier Effect—The refractive index of the phase modulator region can also be controlled by modulating the carrier density in the region. The carriers are generated by both the absorption of the optical power passing through the region and any direct current applied to the region. Generally, the carriers are modulated by applying a reverse bias across this region to sweep out the unnecessary carriers. Since a quantum well having a constant thickness throughout will result in undesirable absorption, it is necessary to use the SAE process to shift the bandgap of this region outside of the operating region and, thus, suppress the optical absorption.
4) Displaced Quantum Well—This is the preferred technique, at least with respect to several of the preferred embodiments according to the present invention being discussed in detail. This technique works by shifting the PN junction toward the N side of the device. The source of carriers in the region will be primarily from absorption of photons from the adjacent regions or the signal passing through the region. Phase modulation is achieved by applying an electric field across the quantum well with an external bias. The photo carriers can now be depleted without causing optical absorption because the field is displaced away from the quantum well and does not cause the band edge to shift with the applied external bias.

It should be mentioned at this point that the phase modulators require an associated control device, e.g., a dedicated microprocessor, or system to control the output phase of each tapered amplifier stage (208a–208n) in the index guided tapered amplifier structure 200. Several control systems of the requisite type are disclosed in U.S. Pat. No. 5,694,408, which patent is incorporated herein by reference in its entirety for all purposes. Additional discussion regarding the operation of the control system will be provided below.

Figure 8:
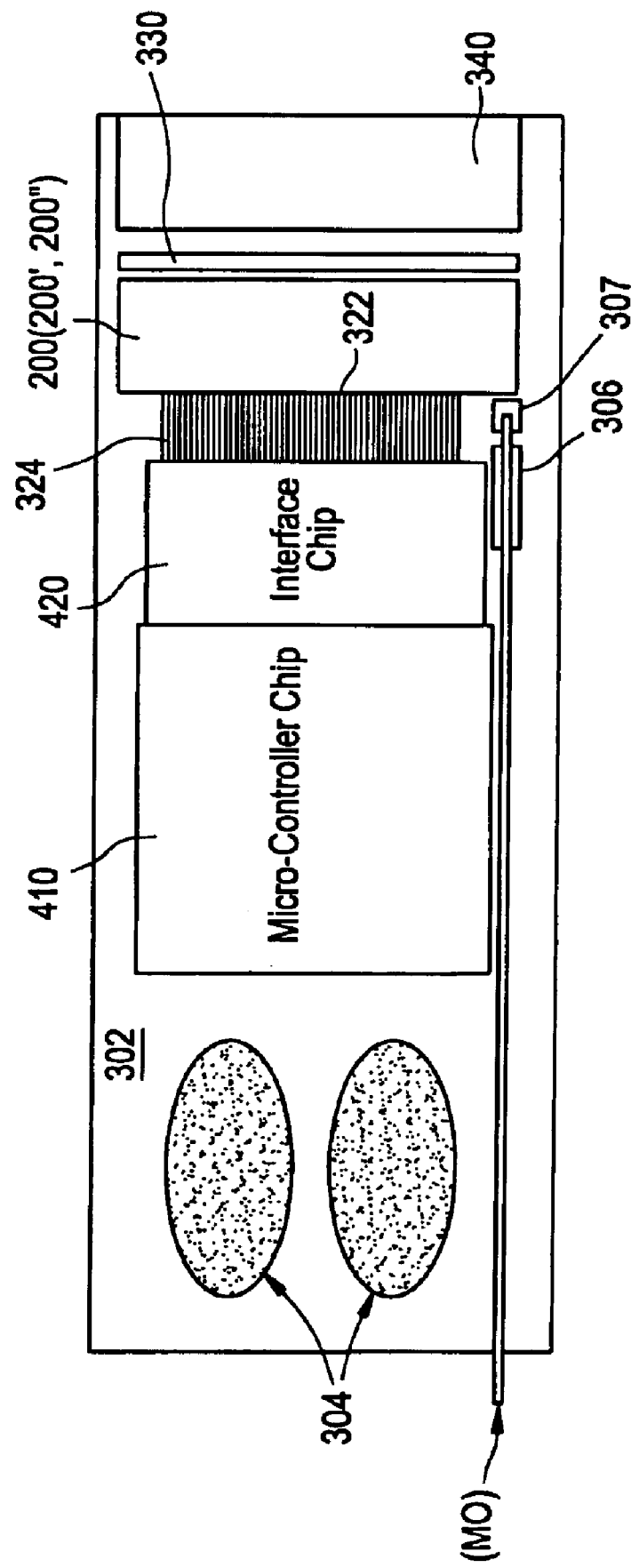
FIG. 8 illustrates an integrated package containing the optical phased arrays depicted in FIGS. 5A, 5B and 6 on a micro-channel cooler structure.

FIG. 8 illustrates another exemplary embodiment of an optical phased array according to the present invention, which array is an integrated package 300 consisting of a heat sink 302 containing fluid inlet and outlet ports 304 upon which is mounted, going from left to right, a microcontroller chip 310, an interface chip 320 connected to a phase array chip 200 (200') illustrated in FIGS. 5 and 6 via control lines 322 on a patterned substrate 324 supported by the heat sink 302, micro-optics 330 suitable for aperture filling, and an outgoing wavefront sampler 340, which will be discussed in greater detail below. It will be appreciated that the integrated package 300 is sometimes referred to as a coherent chip. It will also be appreciated that the optical phased array 200 advantageously can be mounted p-cap side to the heat sink 302. Preferably, the integrated package 300 includes a MEMS device 306, and a lock down structure 307, which permits active fiber alignment and subsequent affixing of the fiber optic. Typical devices include, but are not limited to, those disclosed in U.S. Pat. Nos. 6,280,100, 6,253,011, 6,164,837, 6,124,663, 5,881,198, 5,870,518, 5,606,635, and 5,602,955, all of which are incorporated herein by reference.

It will be appreciated that micro-channel coolers are one form of heat sink for dissipating the heat load generated by the integrated package and, thus, provide a uniform temperature distribution across the device. An isothermal cooler is important for this device so that all of the active emitters on a chip operate at the same wavelength as the master oscillator signal It will also be appreciated that while the micro-controller 310 illustrated in FIG. 8 advantageously can be employed to provide phase alignment of an individual layer, the microcontroller 310 is not limited to an on-board controller. An off-board micro-controller, i.e., located off of the cooler 302, advantageously can be employed when real estate is limited. It should be mentioned at this point that the phase control algorithm implemented by the micro-controller 310 does not need to be high speed for most applications, particularly since, in most situations, a set and forget control scheme can be utilized.

Figure 9:
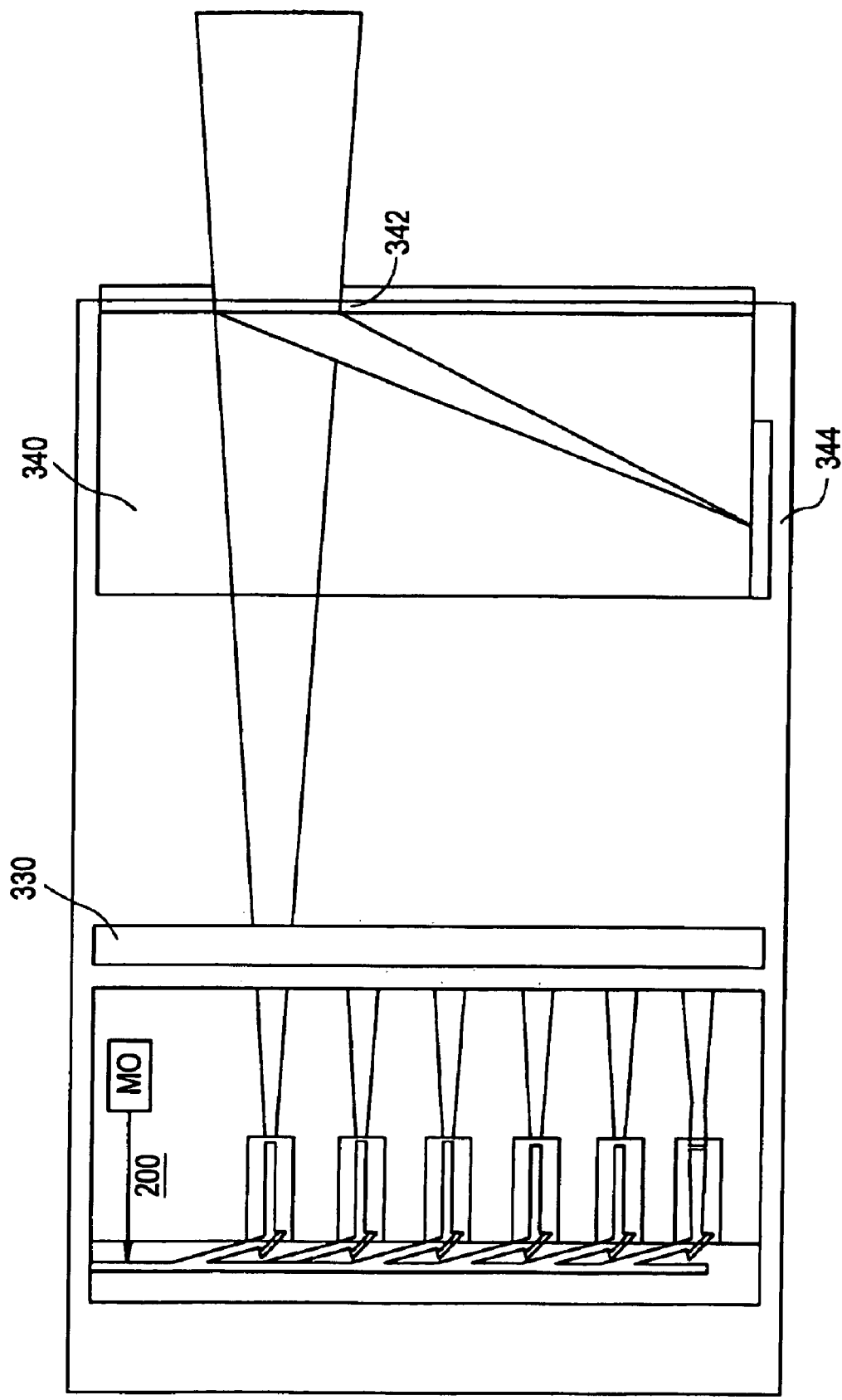
FIGS. 9 and 10 illustrate alternative structures for wavefront sampling, which can be employed for, in an exemplary case, the integrated package illustrated in FIG. 8.
Figure 10:
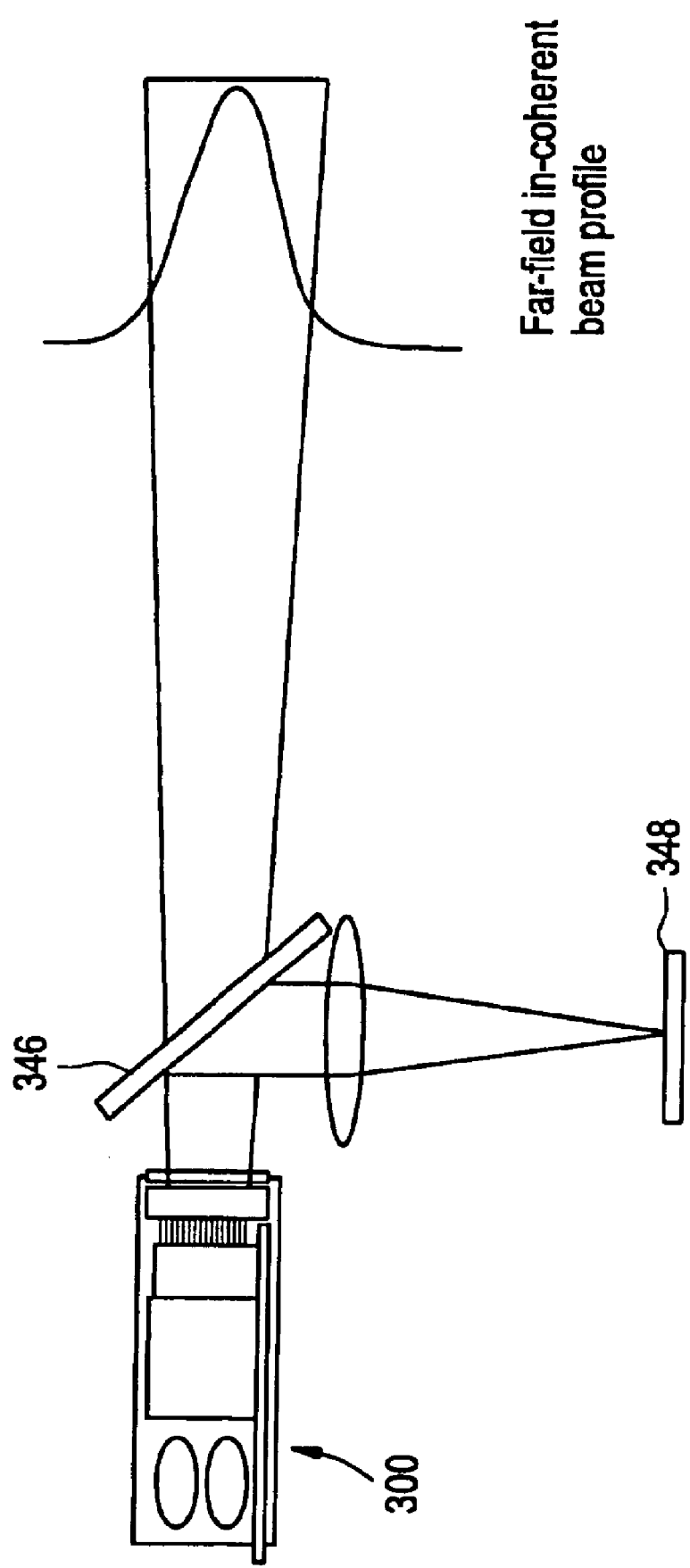

FIGS. 9 and 10 illustrate alternative structures for wavefront sampling, either of which can be employed for, in an exemplary case, the integrated package 300 illustrated in FIG. 8. With respect to FIG. 9, it will be appreciated that there are two basic techniques either of which can be used in constructing the wavefront sampler 340, a simple dielectric mirror or a holographic grating, the latter being preferred. Thus, the wavefront sampler 340 advantageously includes a holographic device 342 and a detector 344. It will be appreciated that detector can be one of several devices including, for example, a simple detector or CCD linear chip array. It will also be appreciated that while the detector 344 is depicted as upstream of the holographic device 342, this arrangement holds true when the holographic device is a holographic mirror. The opposite relationship would govern when the holographic device is a holographic lens. It should also be mentioned at this point that the holographic device and the micro-optics element advantageously can be consolidated when other design constraints permit.

In addition, a conventional waveform sampler, such as that illustrated in FIG. 10, can be employed. As illustrated in FIG. 10, the wavefront sampler 340 is moved off chip; wavefront sampler 340' advantageously includes a beam splitter 346, e.g., a fractional beam splitter, and an optical detector 348. It will be appreciated that which the arrangement shown in FIG. 10 minimizes chip real estate; the overall package size of the optical phased array system would necessarily increase.

Figure 11A:
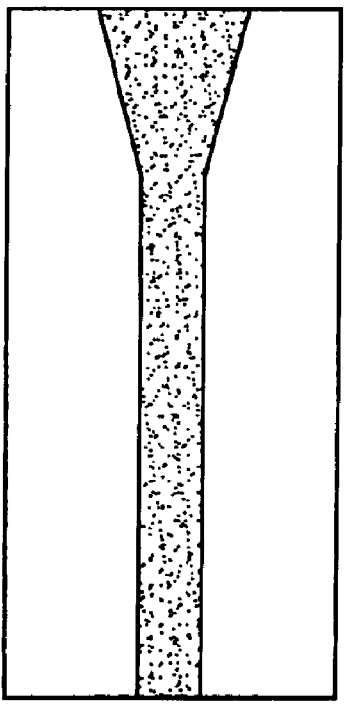
FIGS. 11A and 11B are useful in understanding the operating characteristic of the tailored index single mode guided tapered amplifier according to the present invention.
Figure 11B:
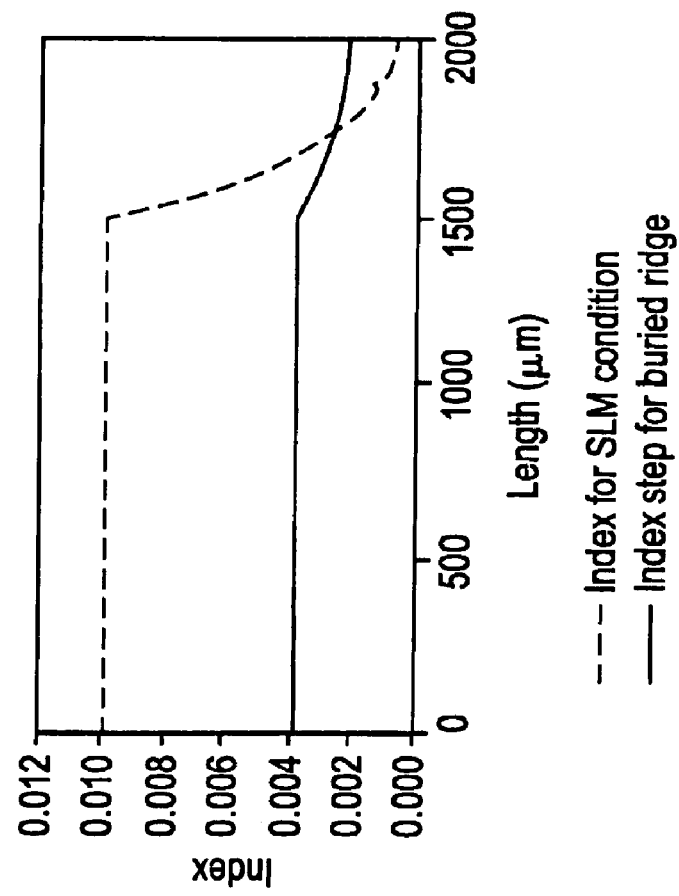
Figure 11C:
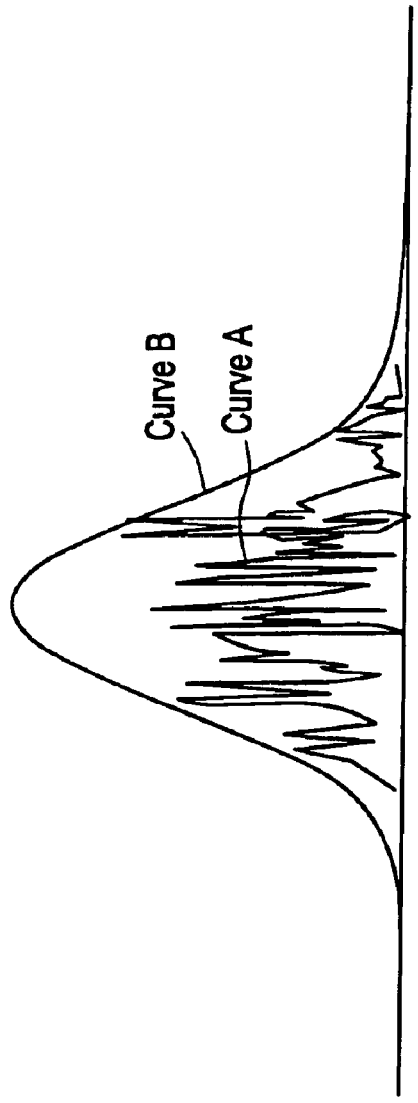
FIGS. 11C and 11D are useful in understanding the operating characteristic of a conventional optical phased array and an optical phased array having a tailored index single mode guided tapered amplifier array according to the present invention.
Figure 11D:
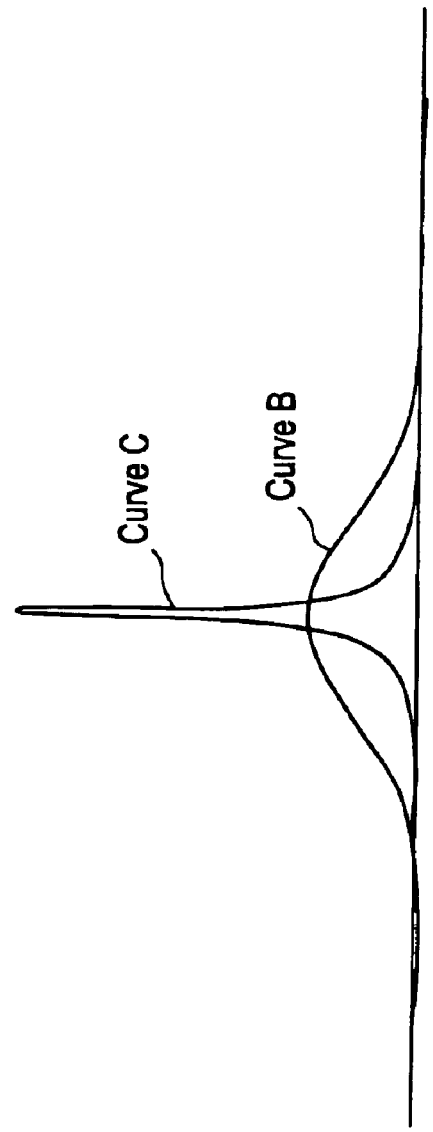

Before discussing the operation of the phase control methodology employed in exemplary embodiments according to the present invention, the operation of a single tailored index single mode amplifier will be briefly described. In FIG. 11A, a top view of the tailored index single mode amplifier 208, which includes portions 150a and 150b (see FIGS. 4B and 4C), while FIG. 11B contrasts the ideal index profile for a single lateral mode laser and the index step variation provided be the exemplary embodiments of the present invention.

The operation of the phase control system discussed briefly above will now be described in greater detail. The control algorithm can take one of two forms, a hill climbing loop in combination with a side lobe minimization technique and an interferometric technique. The results obtained without wavefront control is contrasted with the results obtainable using either technique in FIGS. 11A and 11B, respectively. Curve A of FIG. 11A illustrates the far-field pattern produced by n-emitters that are not coherent while Curve B illustrates the far-field pattern produced by n-emitters that are coherent but do not form a single wavefront. Stated another way, Curve A illustrates the random interference pattern generated by the phased array prior to phase alignment, while Curve B depicts the beam envelope for the incoherent summation of the same emitters. It will be appreciated that Curve A depicts the far-field pattern generated by the device disclosed by U.S. Pat. No. 5,440,576 to Welch et al. In contrast, FIG. 1B illustrates the superposition of Curve B with Curve C, which illustrates the phase aligned far-field pattern produce by the optical phased array 300 depicted in FIG. 8. Inspection of Curve C reveals that it is n-times greater in intensity and n-times narrower in angle than the incoherent summation of the same number of emitters (Curve B). [please check]

In the hill climbing loop technique, the on-axis intensity is monitored as each phase setting on each emitter is tested. The setting that increases the on-axis power is retained while all others settings are discarded i.e. returned to their initial settings. For large arrays, the signal to noise ratio becomes very small and the final phase alignment quality is limited by the ability to see the phase test. One method which increases the signal to noise ratio near convergence is to use the off-axis intensity as the feedback for the control loop. As each phase setting on each emitter is tested, the setting that decreases the off-axis power is retained while all other settings are returned to their initial settings. It will be appreciated that phase tests can be performed in integral steps ranging from a large initial test step for π/2, then π/4, then π/8 etc. until the maximum power coupling is achieved. According to the interferometric technique, near-field phase measurements of each emitter are performed with either a shearing interferometer or a modified Mach-Zender interferometer. Each phase state is adjusted until all phase states approximately match (modulo 2π) the phase of the reference emitter or the master oscillator.

Figure 12:
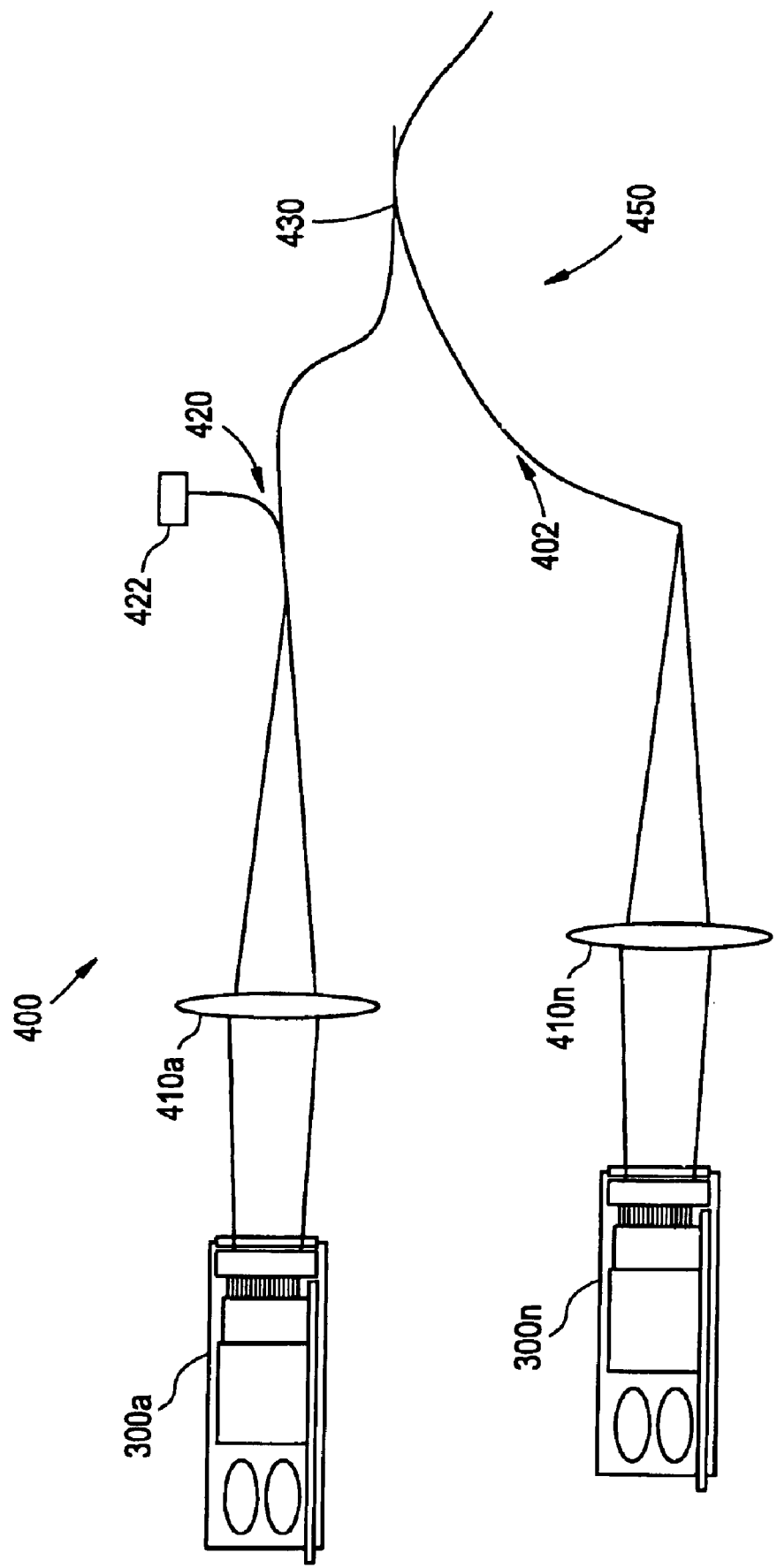
FIG. 12 illustrates one exemplary technique for launching a very high power laser beam generated by an optical phased array having a tailored index single mode guided tapered amplifier structure into a single mode optical fiber.

FIG. 12 illustrates a high-power laser system 400 employing a plurality of the optical phased array monolithic devices 300 depicted in, for example, FIG. 8. In the illustrated exemplary embodiment, the output beams of two coherent chips 300a and 300n are combined and launched into an optical network 440 by lenses 410a, 410a. It will be appreciated that the optical network 440 is composed of a collection of optical fibers 402 (most preferably EDFA (erbium doped fiber amplifier), coupled to one another by coupling devices 430 (one shown). In an exemplary case, the coupling device advantageously can be a standard coupler such as fused bitapered couplers, although, most preferably, the coupler is a wavelength division multiplexing (WDM) coupler (in which light at two different wavelengths propagating along respective fibers is coupled onto a common fiber). Preferably, the output power of the laser system 400 can be measured using a conventional optical tap 420 at a selected wavelength and a detector 422.

It will be appreciated that optical phased arrays can be steered onto the fiber in one or two dimensions. In either case, the maximum steering angle is determined by the size of the emitting aperture and the spacing between apertures. It should be mentioned that while larger displacements are feasible, when the displacements become too large, the corresponding sidelobes become too great.

Figure 13:
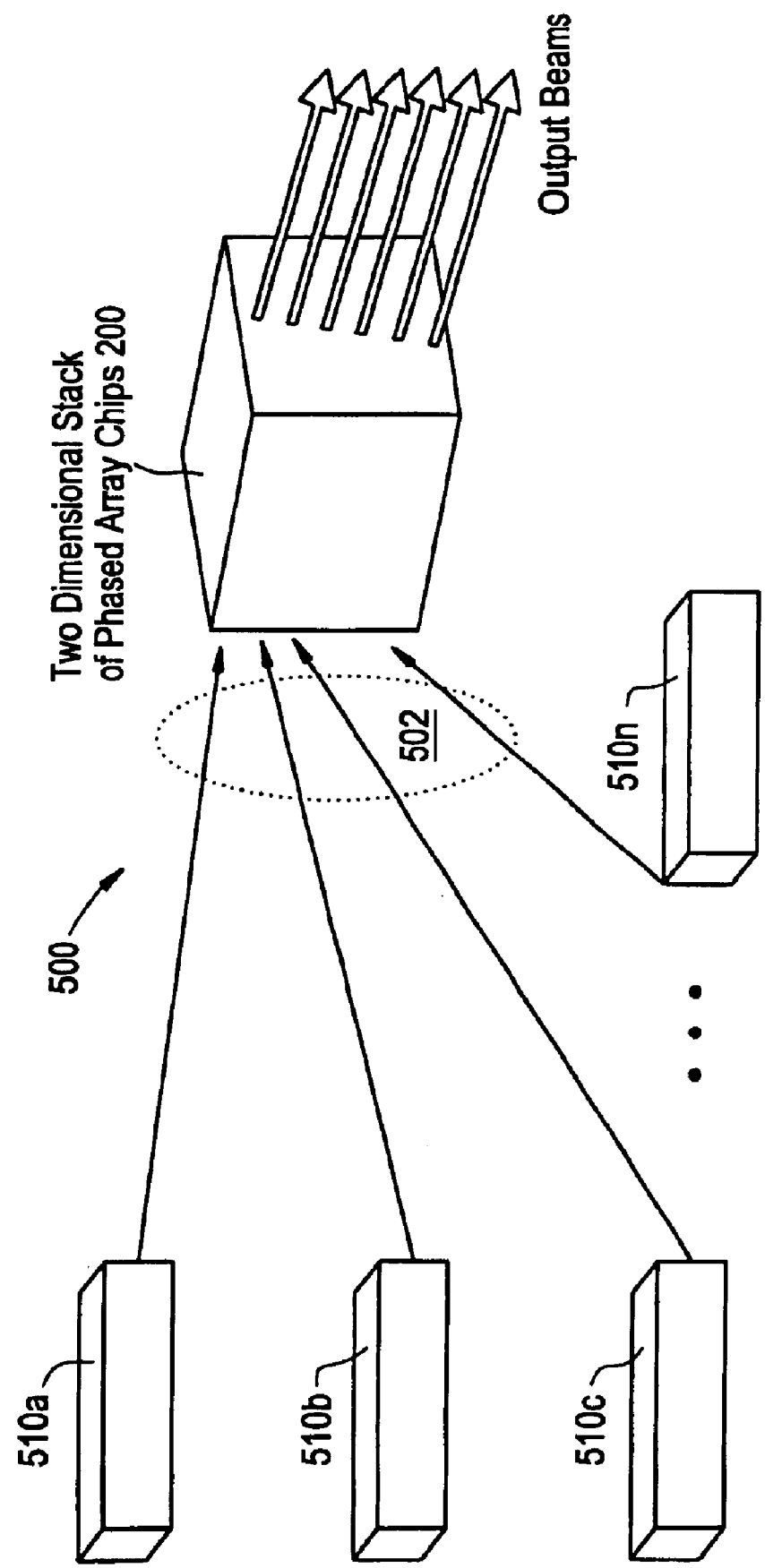
FIGS. 13 and 14 illustrate exemplary embodiments of two dimensional optical phased arrays and supporting structure according to the present invention.

FIG. 13 illustrates another exemplary embodiment of an optical phase array 500 according to the present invention, in which N of the array packages 300a–300n illustrated in FIG. 8 are stacked to form a two-dimensional array 520, each of the array packages 300a–300n being supplied with an input signal from a master oscillator 510a–510n, respectively. In FIG. 13, the master oscillators are off-chip; the input signals from the master oscillators 510a–510n are applied to the array 520 via optical fibers 502. It will be appreciated that the master oscillators alternatively can be integrated on the optical phased array chip (300), i.e., the package shown in FIG. 8. It will also be appreciated that in the optical elements of the phase control subsystem advantageously can be as illustrated in FIG. 9. Since the optical phased array 500 illustrated in FIG. 13 employs multiple master oscillators, the output beams produced by a single array package, e.g., 300a, will all be, or can be made, coherent with respect to one another while incoherent with respect to beams output by the other array packages.

Figure 14:
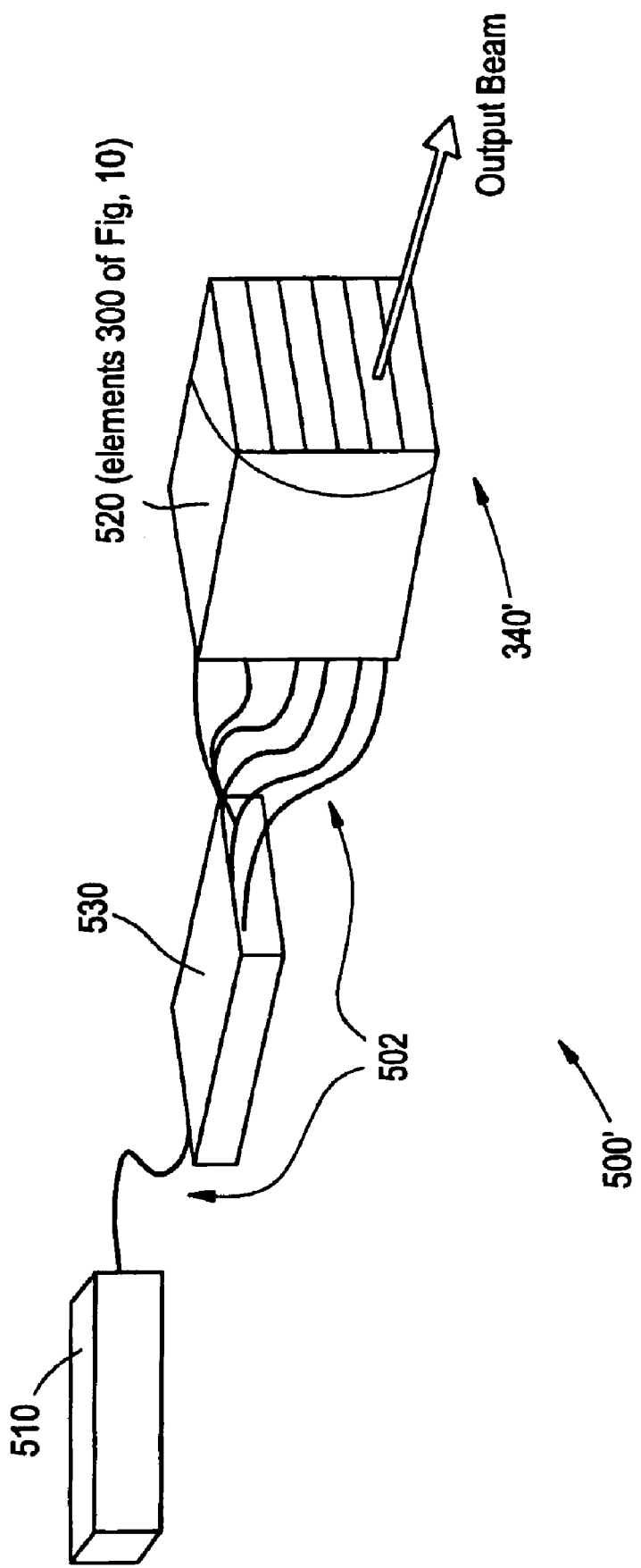

FIG. 14 illustrates another exemplary embodiment of an optical phased array 500' where the array packages shown in FIG. 8 are again stacked to form a fully coherent phased array. Each of the optical phased array chips assemblies are coupled through a power splitting network 530 to a common master oscillator 510. The output of the two dimensional array is sampled and phase controlled according to the methods described in U.S. Pat. No. 5,694,408, which patent is incorporated herein by reference in its entirety for all purposes. The arrangement of optical elements advantageously can be that illustrated in FIG. 10.

It will be appreciated that FIG. 10 can represent a top view of the optical phased array 520' illustrated in FIG. 14. Given that perspective, it will be understood that the fractional beam splitter 346 illustrated in that figure advantageously can be employed as a beam steering device, i.e., the output beams can be coupled out of facet of each of the chips 200 disposed in optical phased array 520'. It will also be appreciated that the same effect can be obtained using either gratings or turning mirrors. Thus a N emitter devices in the optical phased array 520' could be segmented into a L sets of M emitters, i.e., M×L=N, with all beams being directed along the optical axes of the chips generally denoted 200. The power amplifiers 208a–208n thus would feed directly into this beam deflector. Phase control would be as discussed above.

As discussed above, a first embodiment of the present invention includes a semiconductor device constructed from at least one tailored index single mode optical amplifier. It will be appreciated that the tailored index step provides direct control of the real refractive index inside of the waveguide compared to outside of the waveguide. The wave-front or phase-front of the beam changes in response to this real index step with the goal being to keep the wavefront substantially flat over the expanding regions. In an exemplary case, the tailored index is produced by tailoring a current profile applied to the amplifier, the profile varying in at least one and possibly two dimensions. Alternatively, the tailored index step can be provided by implantation of impurities in regions of the device adjacent to the amplifier structure. Moreover, the tailored index step can be produced by varying the height of the buried rib in the amplifier region. When the optical amplifier includes a heat sink, the tailored index step of the amplifier can be provided by varying the thermal impedance characteristic of the junction at the heatsink. It will be appreciated that the tailored index step advantageously can be produced by any combination of the structural variations mentioned immediately above, either alone or in combination with any other index tailoring technique known to one of ordinary skill in the art.

If desired, the semiconductor can include an optical element coupled to the tailored index single mode optical amplifier, which optical element modifies or controls the wavefront of the output signal from the tailored index single mode optical amplifier. Moreover, the semiconductor can (also) include an electro-optical element, i.e., an active element, coupled to the tailored index single mode optical amplifier, which active optical element modifies or controls at least one characteristic of the output signal from the tailored index single mode optical amplifier. In an exemplary embodiment, the controlled characteristic is phase angle of phase delay.

It will be appreciated that the tailored index single mode amplifier advantageously can be employed as coupling means for coupling an optical signal (or signals) either into or out of the device, or into or out of another element in the optical signal path or paths in the semiconductor device. In an exemplary case, the signal (signals) is (are) coupled into or out of the device via an optical fiber. Alternatively, the signal (signals) is (are) coupled into or out of the device via a free space optical signal path. In either case, the optical signal path advantageously can include at least one of a signal splitter, a modulator, a master oscillator, a waveguide of a different type, or other signal element known to one of ordinary skill in the art. Preferably, the input or output coupling is effected at a facet of the device exposing the epitaxial layers of the semiconductor device. Alternatively, the device includes a means for coupling optical signals from one optical element to another with relaxed alignment tolerances in the plane of the semiconductor while the other axis is confined and aligned by the transverse guiding layers.

Alternatively, the device includes means for coupling optical signals into and out of the surface of the device, where the input or output coupling is effected at the surface of the device.

Stated another way, the tailored index structure advantageously can be employed for impedance matching a source being coupled into it or an amplified signal being coupled out of it. For example, a fiber coupling into a tapered-tailored structure would have a less restrictive alignment tolerance in at least one axis. In practical terms, the alignment tolerances in coupling from one waveguide device, i.e., a phase modulator, to another waveguide device, i.e., the tailored index single mode optical amplifier, would be relaxed. If the two devices are fabricated in separate steps, this design would greatly relax the alignment tolerances that would have to be maintained. For example, a 2 micron waveguide requires the accepting waveguide to be aligned to within a tenth of 2 microns; when the waveguide is flared to 8 microns, then it only needs to be aligned to a tenth of 8 microns, or 0.8 microns, i.e., a much easier problem. It will be noted that the flared waveguide advantageously provides both additional lateral alignment tolerance and a better numerical aperture (NA) match to fibers or other waveguide devices.

It should be mentioned that the tailored index aspect of the single mode amplifier (or waveguide) can ease the problem of coupling a single mode optical signal into or out of a device or chip. This is because the index tailoring tends to stabilize the mode over a range of temperatures and other operating conditions, e.g., drive current into the amplifier or waveguide, and reduce astigmatism. Thus, the optical problem of coupling the emission from the tailored index single mode optical amplifier into an external optical train, e.g., path (which could be an optical fiber), or from an external optical train into the tailored index single mode optical amplifier, is facilitated in a practical engineering sense. The discussion which follows provides an example of how tailored index waveguides can improve coupling into and out of certain elements in the optical signal path found in certain preferred embodiments according to the present invention.

The discussion above referred to a "distribution network" or a "signal distribution network." Such a network generally must incorporate signal splitters and other optical elements for routing the optical signals around, for example, the chip. The latter is difficult compared to electric signal routing on a circuit card, because photons are "line of sight" entities; they are not easily convinced to change directions. One mechanism for routing photons through an angle (and here there is a practical maximum to the included angle, although 90 degrees is well within the state of the art) in a waveguide implemented in devices such as the disclosed embodiments of the invention is a "tuning mirror". This is implemented as a vertical-walled "deep" etch, where "deep" denotes "through the photon guiding layers in the epitaxial layers of the device." To implement a 90 degree turning mirror, such a mirror is etched at a 45 degree angle across a waveguide in the epitaxial layers. If a second waveguide is implemented in the epitaxial layers such that it is a reflection of the first in the vertical wall of the turning mirror, then photons travelling down either waveguide toward the turning mirror will be reflected off the mirror, and continue outbound in the other waveguide. It will be appreciated that the mechanism described here is total internal reflection, which means that there is also a minimum included angle limit to these devices.

It should be mentioned that there are some important practical problems in implementing this type of turning mirror. Since it usually involves mask step(s) in the wafer processing different from those that create the waveguides, alignment errors can arise. In extreme cases, these errors can be so severe that the reflected photons are not captured by the outbound waveguide, and are lost in the substrate. In typical cases, every turning mirror imposes a signal loss—which is undesirable. One technique for reducing these losses is to taper the waveguides as they approach the mirror. Thus the "acceptance angle" of the outbound waveguide is increased, and more off-angle photons are gathered—thus preserving signal.

When using a surface rib, the tapered region of the tapered waveguides approaching the turning mirror tended to deform the mode (and, in extreme cases, split the mode). Whether this occurred on the input waveguide or the output waveguide, it reduced the coupling efficiency through the turning mirror, and imposed signal loss. With the index tailoring capability, the present invention provides the ability to implement tapered (sometimes called "flared") waveguide features at the turning mirrors and, thus, provide increased tolerance to angle or position errors on the turning mirrors, without incurring nearly as much of a penalty in coupling due to mode deformation in the waveguide.

Another important consideration are waveguides that have tailored indexes in a device (or substrate) that also has waveguides that do NOT have tailored index. To give a specific example, another common feature of on-chip distribution networks is a splitting element, i.e., conventional T-branches and Y-branches. In these devices, it would be desirable to physically split an optical signal according to some predetermined ratio into two or more signals. In the case of Y-branches, this has been done by the simple expedient of forming a "Y" in the waveguide. An optical signal arriving from the leg of the Y is split by the point between the two branches of the Y, and the derived signals continue up their respective branches.

In this type of device, it is actually undesirable for the input waveguide to have an index characteristic that strongly selects for a tight mode as it approaches the split. Rather, it is beneficial for the index characteristic to split the mode laterally into two parallel modes just before the split. This is exactly the tendency of a "non tailored index" single mode tapered waveguide—and in this case, it would be counter-productive to do anything to mitigate this tendency. Since the most useful or flexible distribution network topologies require both waveguide branching and turning, the distribution network according to the present invention, which includes both tailored and non-tailored waveguides, accommodates both types of waveguiding functions in the same device or chip.

Another exemplary embodiment according to the present invention includes a device for generating N outputs, each having a tailored index single mode optical amplifier. The device can be implemented on a single, epitaxially grown, semiconductor substrate. If desired, additional features can be added to the device, e.g., on this substrate, to increase the functionality and utility of the device. These "features" may include, but are not limited to, phase modulators, a distribution network (with all of its possible sub-components), master oscillator(s), and those forms of optical features that can be etched or implanted or otherwise processed into the fabric of the substrate itself.

When the distribution network includes vertical turning mirrors (or other forms of "vertical" out-couplers) that enable the coupling of optical signals into and out of the surface of the substrate, then the device provides a two-dimensional distribution of outputs, which is not to say a rectilinear distribution). It will be appreciated that all of the additional features mentioned above in connection with a one-dimensional array device apply to a two-dimensional array device, so long as the device incorporates at least one vertical coupling element.

A semiconductor device comprising an optical phased array having N output amplifiers, wherein each of the output amplifiers is a tailored index single mode amplifier, the N output amplifiers are disposed on a single substrate, and N is an integer equal to or greater than 2. Preferably, each of the N tailored index single mode output amplifiers has a buried rib structure. If desired, each of the N tailored index single mode output amplifiers can have a surface rib structure. If the device includes a heat sink, the tailored index step of the output amplifiers is provided by varying the thermal impedance characteristic of the junction at the heatsink. Preferably, the heatsink is disposed adjacent to the N power amplifiers. In other exemplary embodiments, the tailored index step of the output amplifiers is provided by either implantation of impurities in regions of the device adjacent to the amplifier structure, or tailoring a current profile applied to the amplifier, the profile varying in at least one and possibly two dimensions, or varying the height of the buried rib in the amplifier region. It will be appreciated that the tailored index can be provided by any combination of any of the aforementioned structural variations, alone or in combination with any other technique known to one of ordinary skill in the art as being capable of varying the index of the optical amplifier so as to produce the tailored index single mode amplifier.

It will be noted that the N tailored index single mode amplifiers can be disposed in either a linear or a two-dimensional array. Moreover, it will be noted that at least one of the input and output regions of the semiconductor device for the linear array correspond to a facet of the semiconductor device exposing the epitaxial layers of the semiconductor device. Alternatively, the semiconductor device includes coupling elements for coupling optical signals into and out of the surface of the device, and wherein the one or two dimensional pattern is implemented as surface emitters or receptors from the semiconductor device. It will be appreciated that a combination of surface and facet couplers is possible on the same device.

It will also be noted that the semiconductor device advantageously can include N optical control devices such that each of the optical control devices modifies or controls at least one characteristic of a respective optical emission from one of the N amplifiers of the device. It will be appreciated that the operation of the N optical control devices can one of increase the collimation of the individual optical outputs of the amplifiers and improve the geometric fill factor in the device of the combined optical outputs of the respective amplifiers. It will be appreciated that optical control device connotes both optical elements (passive devices) and electro-optical devices (active elements), e.g., a phase modulator.

In another exemplary embodiment, the semiconductor device includes N (N−1) phase modulators located in the optical signal paths upstream of the N (N−1) tailored index single mode amplifiers, respectively. Regardless of the number of phase modulators, all of the phase modulators cooperatively modify the pattern of optical emission from the semiconductor device by improving the collimation of the optical output of the semiconductor device. The semiconductor device can include a means of individually controlling the N (N−1) phase modulators such that the phases of the output signals from each (N−1) of the N output amplifiers may be independently controlled with respect to each other. In a further embodiment, the semiconductor device advantageously includes an optical signal source, e.g., a master oscillator or a resonant optical cavity that gives rise to lasing. In the latter configuration, cavity advantageously can be (partly) formed by one of partially reflective coatings at any surface of the device and grating(s) or other selectively reflecting device(s) implemented in an optical signal path within the semiconductor device. When the only one reflective coating, device, or grating is integral to the semiconductor device, a complementary partially reflective device can be disposed external to the semiconductor device to complete the resonant cavity.

Semiconductor lasers are formed when a medium has sufficient gain to overcome the round trip optical losses in the cavity. A typical semiconductor laser has a facet coating that is highly reflective on one end and greater than a few percent on the other. In contrast, because of the high gain that can be achieved in a semiconductor laser, fabricating a semiconductor amplifier requires very low facet reflectivities. A typical semiconductor amplifier will have the facets antireflection coated with a reflectivity significantly less than 1%. Another practice is to tilt the waveguide with respect to the output or input facets. This tilt causes a slight mode mismatch for any reflected mode at the facet and as result helps to suppress any parasitic lasing the occurs in the amplifier. The semiconductor devices described above all have antireflection coatings and may incorporate a tilt at the facet to reduce the back reflections.

In a still further embodiment, the semiconductor device advantageously can include a distribution network for coupling an optical source signal to the N tailored index single mode amplifiers. In an exemplary case, the distribution network includes waveguides and signal splitters that route a common optical source signal to each of the N amplifiers so as to preserve coherence of the optical source signal to each of the N output amplifiers. In an alternative case, the distribution network includes waveguides and signal splitters that route optical source signals to selected ones of the N amplifiers. In either case, the distribution network can incorporate active waveguides that reamplify the optical source signal (signals) to mitigate splitting losses. Preferably, the distribution network incorporates one of a t-branch, a y-branch, and signal splitting means.

A system comprising an optical phased array of N tailored index single mode amplifiers, N (N−1) phase modulators disposed upstream of (selected ones of) the N tailored index single mode amplifiers, an optical signal source producing a optical signal, and distribution network for distributing the optical signal to (the selected ones of) the N (N−1) phase modulators, wherein N is an integer equal to or greater than 2. If desired, the system can include a controller for controlling the N (N−1) phase modulators. Control signals generated by the controller advantageously can be routed to selected ones of the N (N−1) phase modulators via interface circuitry. The controller advantageously can be responsive to a signal generated by a measuring device which measures parameters characteristic of selected ones of the output signals produced by the N tailored index single mode amplifiers.

In an exemplary case, the N tailored index single mode amplifiers, the N (N−1) phase modulators, a portion of the distribution network are supported by a single support element. In that case, the distribution network can include a free space portion. In another exemplary case, the N tailored index single mode amplifiers, the N (N−1) phase modulators, a portion of the distribution network, and the interface circuitry are supported by a single support element. In a further exemplary case, the N tailored index single mode amplifiers, the N (N−1) phase modulators, a portion of the distribution network, the controller, and the interface circuitry are supported by a single support element. In a still further embodiment, the N tailored index single mode amplifiers, the N (N−1) phase modulators, a portion of the distribution network; the controller, the optical signal source, and the interface circuitry are supported by a single support element. In a still further embodiment, the N tailored index single mode amplifiers; the N (N−1) phase modulators, the distribution network, the controller, the optical signal source, and the interface circuitry are supported by a single support element. In yet another embodiment, the N tailored index single mode amplifiers, the N (N−1) phase modulators, the distribution network, the controller, the optical signal source, the measuring device, and the interface circuitry are all supported by a single support element.

With respect to the controller and measuring device, when the measuring device measures the near-field phase pattern produced by the N tailored index single mode amplifiers, the controller effects continuous or persistent optimization of the far-field emission of the N tailored index single mode amplifiers by appropriately controlling N (N−1) of the phase modulators associated with the N tailored index single mode amplifiers. In contrast, when the measuring device generates measurement signals representing the relative phases of the output signals of the N tailored index single mode amplifiers to each other (or to a common phase reference signal), the controller effects continuous (persistent) optimization of the far-field emission of the N tailored index single mode amplifiers by appropriately controlling at least (N−1) of the phase modulators associated with the N tailored index single mode amplifiers. When the measuring means measures (estimates) the power generated by the N tailored index single mode amplifiers incident on a remote target, through a homogeneous (inhomogeneous) medium that is time-variant (time-invariant), the controller effects continuous (persistent) maximization of power from the N tailored index single mode amplifiers incident on the target by appropriately controlling at least (N−1) of the phase modulators associated with N tailored index single mode amplifiers. In contrast, when the measuring device measures (estimates) the power coupled from the device into an optical fiber, the controller effects continuous (persistent) maximization of power from the N tailored index single mode amplifiers coupled into the optical fiber by appropriately controlling at least (N−1) of the phase modulators associated with the N tailored index single mode amplifiers. In any case, it will be appreciated that the control signals generated by the controller permit individual control of the N (N−1) phase modulators such that the phases of the output signals from each of the N tailored index single mode amplifiers may be independently controlled with respect to each other.

It will be noted from the discussion above that the distribution network includes waveguides and signal splitters that split and communicate the common optical signal source or sources to each of the N tailored index single mode amplifiers so as to preserve coherence of the common optical signal source or sources to each of the N tailored index single mode amplifiers. Preferably, the distribution network incorporates active waveguides that reamplify the signal or signals to mitigate splitting losses. The distribution network can incorporate t-branches, y-branches, and other signal splitting elements known to one of ordinary skill in the art, As discussed above, the output signals generated by the N tailored index single mode amplifiers can be: used independently; combined non-coherently; or combined coherently. Moreover, M of the N tailored index single mode amplifiers can be injection locked from a fundamental common optical signal, where M and N are positive integers and M is less than or equal to N. Preferably, the distribution network routes the common optical signal to the M of the N tailored index single mode amplifiers; the distribution network can include a free-space optical signal path.

Although presently preferred embodiments of the present invention have been described in detail herein, it should be clearly understood that many variations and/or modifications of the basic inventive concepts herein taught, which may appear to those skilled in the pertinent art, will still fall within the spirit and scope of the present invention, as defined in the appended claims. In particular, it will be appreciated that portions or element of the exemplary embodiments of the present invention illustrated in the various figures can be extracted and combined to form variations of the invention embraced by the appended claims but not expressly described; all such variations are considered to be within the scope of the appended claims.

What is claimed is:

1. A semiconductor device comprising:
   at least one tailored index single mode optical amplifier; and
   a heat sink,
   wherein the tailored index associated with the optical amplifier is produced by varying the thermal impedance characteristic of the junction at the heatsink.

2. A semiconductor device comprising at least one tailored index single mode optical amplifier,
   wherein the tailored index associated with the optical amplifier is produced by varying at least two of:
   a current profile applied to the optical amplifier;
   the thermal impedance characteristic of a junction between the optical amplifier and a heatsink thermally coupled thereto;
   impurity densities in regions of the semiconductor device adjacent to the optical amplifier;
   the height of a buried rib along the optical axis as the width varies from a first to a second predetermined value; and
   the height of a surface rib along the optical axis as the width varies from a first to a second predetermined value.

3. A semiconductor device comprising:
   at least one tailored index single mode optical amplifier;
   an input waveguide for coupling an optical signal into the optical amplifier; and
   an output waveguide for coupling an amplified signal out of the optical amplifier.

4. The semiconductor device as recited in claim 3, wherein the output waveguide comprises an optical element for extracting the amplified signal out of a surface parallel to the optical axis of the optical amplifier.

5. The semiconductor device as recited in claim 4, wherein the optical element comprises a turning mirror.

6. The semiconductor device as recited in claim 4, wherein the optical element comprises a diffraction grating.

7. The semiconductor device as recited in claim 3, wherein the input waveguide comprises a tailored index waveguide.

8. The semiconductor device as recited in claim 3, wherein the input waveguide comprises a tapered waveguide.

9. The semiconductor device as recited in claim 3, wherein the semiconductor device comprises epitaxial layers, and
wherein at least one of the input waveguide and the output waveguide couples one of the optical signal and the amplified signal at a boundary plane of the optical amplifier intersecting the epitaxial layers.

10. The semiconductor device as recited in claim 9, wherein the boundary plane is not perpendicular to the optical axis of the optical amplifier.

11. A semiconductor device comprising:
a tailored index single mode optical amplifier including means for tailoring a structural characteristic associated with the optical amplifier to thereby provide the tailored index;
first coupling means for coupling an optical signal into the optical amplifier; and
second coupling means for coupling an amplified signal out of the optical amplifier.

12. The semiconductor device as recited in claim 11, wherein at least one of the first and second coupling means comprises an optical fiber.

13. The semiconductor device as recited in claim 11, wherein at least one of the first and second coupling means comprises a free space optical path portion.

14. The semiconductor device as recited in claim 11, wherein at least one of the first and second coupling means comprises a phase modulator.

15. The semiconductor device as recited in claim 18, wherein the N tailored index single mode output amplifiers are disposed in a linear array.

16. The semiconductor device as recited in claim 15, wherein at least one of the input and output regions of the semiconductor device associated with the linear array corresponds to a facet of the semiconductor device exposing the epitaxial layers of the semiconductor device.

17. The semiconductor device as recited in claim 18, wherein the N tailored index single mode output amplifiers are disposed in a two-dimensional planar array.

18. A semiconductor device comprising:
an optical phased array having N output amplifiers.
wherein each of the output amplifiers comprises a tailored index single mode amplifier, the N output amplifiers are disposed on a single substrate, and N is an integer equal to or greater than 2, and
wherein the semiconductor device further comprises coupling elements for coupling optical signals one of into and out of the surface of the semiconductor device.

19. A semiconductor device comprising:
an optical phased array having N output amplifiers,
wherein each of the output amplifiers comprises a tailored index single mode amplifier, the N output amplifiers are disposed on a single substrate, and N is an integer equal to or greater than 2, and
wherein each of the N optical amplifiers is optically coupled to one of a surface emitter and a receptor disposed on a layer of the semiconductor device.

20. A semiconductor device comprising:
a distribution network receiving an optical source signal and generating N distributed signals;
N−1 phase modulators receiving N−1 of the N distributed signals and generating N−1 phase modulated signals;
an optical phased array having N output amplifiers, each of the N optical amplifiers receiving one of the N−1 phase modulated signals or the N distributed signals,
wherein each of the output amplifiers comprises a tailored index single mode amplifier,
wherein the N output amplifiers, the N−1 phase modulators, and the distribution network are disposed on a single substrate, and
wherein N is an integer equal to or greater than 2.

21. The semiconductor device as recited in claim 20, wherein the N tailored index single mode output amplifiers are disposed in a linear array.

22. The semiconductor device as recited in claim 21, wherein at least one of the input and output regions of the semiconductor device associated with the linear array corresponds to a facet of the semiconductor device exposing the epitaxial layers of the semiconductor device.

23. The semiconductor device as recited in claim 20, wherein each of the N−1 phase modulators increases the collimation of the individual optical outputs of N−1 of the N output amplifiers.

24. The semiconductor device as recited in claim 20, wherein the N−1 phase modulators collectively improve the geometric fill factor of the combined optical outputs of the N output amplifiers.

25. The semiconductor device as recited in claim 20, wherein the N tailored index single mode output amplifiers are disposed in a two-dimensional planar array.

26. The semiconductor device as recited in claim 25, wherein the semiconductor device further comprises coupling elements for coupling optical signals one of into and out of the surface of the semiconductor device.

27. The semiconductor device as recited in claim 25, wherein each of the N optical amplifiers is optically coupled to one of a surface emitter or a receptor disposed on a layer of the semiconductor device.

28. The semiconductor device as recited in claim 25, wherein each of the N−1 phase modulators increases the collimation of the individual optical outputs of N−1 of the N output amplifiers.

29. The semiconductor device as recited in claim 20, wherein the N−1 phase modulators collectively improve the geometric fill factor of the combined optical outputs of the N output amplifiers.

30. A semiconductor device comprising:
a master oscillator generating an optical source signal;
a distribution network receiving the optical source signal and generating N distributed signals;
N−1 phase modulators receiving N−1 of the N distributed signals and generating N−1 phase modulated signals;
an optical phased array having N output amplifiers, each of the N optical amplifiers receiving one of the N−1 phase modulated signals or the N distributed signals,
wherein each of the output amplifiers comprises a tailored index single mode amplifier,
wherein the N output amplifiers, the N−1 phase modulators, the distribution network, and the master oscillator are all disposed on a single substrate, and
wherein N is an integer equal to or greater than 2.

31. The semiconductor device as recited in claim 30, wherein the N tailored index single mode output amplifiers are disposed in a linear array.

32. The semiconductor device as recited in claim 31, wherein at least one of the input and output regions of the semiconductor device associated with the linear array corresponds to a facet of the semiconductor device exposing the epitaxial layers of the semiconductor device.

33. The semiconductor device as recited in claim 30, wherein each of the N−1 phase modulators increases the collimation of the individual optical outputs of N−1 of the N output amplifiers.

34. The semiconductor device as recited in claim 30, wherein the N−1 phase modulators collectively improve the geometric fill factor of the combined optical outputs of the N output amplifiers.

35. The semiconductor device as recited in claim 30, wherein the N tailored index single mode output amplifiers are disposed in a two-dimensional planar array.

36. The semiconductor device as recited in claim 35, wherein the semiconductor device further comprises coupling elements for coupling optical signals one of into and out of the surface of the semiconductor device.

37. The semiconductor device as recited in claim 35, wherein each of the N optical amplifiers is optically coupled to one of a surface emitter or a receptor disposed on a layer of the semiconductor device.

38. The semiconductor device as recited in claim 35, wherein each of the N−1 phase modulators increases the collimation of the individual optical outputs of N−1 of the N output amplifiers.

39. The semiconductor device as recited in claim 30, wherein the N−1 phase modulators collectively improve the geometric fill factor of the combined optical outputs of the N output amplifiers.

* * * * *